(12) United States Patent
Dasgupta et al.

(10) Patent No.: US 10,770,575 B2
(45) Date of Patent: Sep. 8, 2020

(54) VERTICAL GROUP III-N DEVICES AND THEIR METHODS OF FABRICATION

(71) Applicant: Intel Corporation, Santa Clara, CA (US)

(72) Inventors: Sansaptak Dasgupta, Hillsboro, OR (US); Han Wui Then, Portland, OR (US); Marko Radosavljevic, Portland, OR (US); Pavel M. Agababov, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/321,722

(22) PCT Filed: Sep. 30, 2016

(86) PCT No.: PCT/US2016/055059
§ 371 (c)(1),
(2) Date: Jan. 29, 2019

(87) PCT Pub. No.: WO2018/063409
PCT Pub. Date: Apr. 5, 2018

(65) Prior Publication Data
US 2020/0066893 A1  Feb. 27, 2020

(51) Int. Cl.
*H01L 29/15* (2006.01)
*H01L 29/778* (2006.01)
(Continued)

(52) U.S. Cl.
CPC ...... *H01L 29/7788* (2013.01); *H01L 29/0653* (2013.01); *H01L 29/0657* (2013.01);
(Continued)

(58) Field of Classification Search
CPC ............. H01L 29/7788; H01L 29/0653; H01L 29/0657; H01L 29/0647
See application file for complete search history.

(56) References Cited

U.S. PATENT DOCUMENTS

2007/0045670 A1 * 3/2007 Kuraguchi ............ H01L 29/407
257/249
2010/0078688 A1 4/2010 Otake et al.
(Continued)

OTHER PUBLICATIONS

International Preliminary Report on Patentability for International Patent Application No. PCT/US2016/055059 dated Apr. 11, 2019, 8 pgs.
(Continued)

*Primary Examiner* — Phuc T Dang
(74) *Attorney, Agent, or Firm* — Schwabe, Williamson & Wyatt, P.C.

(57) ABSTRACT

Vertical Group III-N devices and their methods of fabrication are described. In an example, a semiconductor structure includes a doped buffer layer above a substrate, and a group III-nitride (III-N) semiconductor material disposed on the doped buffer layer, the group III-N semiconductor material having a sloped sidewall and a planar uppermost surface. A drain region is disposed adjacent to the doped buffer layer. An insulator layer is disposed on the drain region. A polarization charge inducing layer is disposed on and conformal with the group III-N semiconductor material, the polarization charge inducing layer having a first portion disposed on the sloped sidewall of the group III-N semiconductor material and a second portion disposed on the planar uppermost surface of the group III-N semiconductor material. A gate structure is disposed on the first portion of the polarization charge inducing layer.

23 Claims, 20 Drawing Sheets

(51) Int. Cl.
*H01L 29/06* (2006.01)
*H01L 29/08* (2006.01)
*H01L 29/20* (2006.01)
*H01L 29/423* (2006.01)
*H01L 29/66* (2006.01)

(52) U.S. Cl.
CPC ...... *H01L 29/0847* (2013.01); *H01L 29/2003* (2013.01); *H01L 29/42356* (2013.01); *H01L 29/66462* (2013.01)

(56) References Cited

U.S. PATENT DOCUMENTS

| | | |
|---|---|---|
| 2013/0043468 A1 | 2/2013 | Adekore |
| 2014/0094223 A1* | 4/2014 | Dasgupta ............ H01L 29/4236 455/566 |
| 2014/0197407 A1 | 7/2014 | Yamazaki |
| 2014/0203352 A1 | 7/2014 | Chuang et al. |
| 2014/0252442 A1 | 9/2014 | Chuang et al. |
| 2014/0264379 A1* | 9/2014 | Kub ................. H01L 29/41725 257/77 |

OTHER PUBLICATIONS

International Search Report and Written Opinion for International Patent Application No. PCT/US2016/055059 dated Jun. 26, 2017, 11 pgs.

\* cited by examiner

VERTICAL GROUP III-N DEVICES AND THEIR METHODS OF FABRICATION

CROSS-REFERENCE TO RELATED APPLICATION

This patent application is a U.S. National Phase Application under 35 U.S.C. § 371 of International Application No. PCT/US2016/055059, filed Sep. 30, 2016, entitled "VERTICAL GROUP III-N DEVICES AND THEIR METHODS OF FABRICATION," which designates the United States of America, the entire disclosure of which is hereby incorporated by reference in its entirety and for all purposes.

TECHNICAL FIELD

Embodiments of the present invention generally relate to microelectronic devices and their methods of fabrication, and more particularly to vertical group III-N transistor architecture and design.

BACKGROUND

In the fields of wireless communication and power management, various components can be implemented using solid-state devices. For example, in radio frequency (RF) communication, the RF front-end is a generic term for the circuitry between an antenna and a digital baseband system. Such RF front-end components may include one or more transistors, such as one or more field-effect transistors (FETs). Due, in part, to their large bandgap and high mobility, gallium nitride (GaN) and other group III-N semiconductor materials are suited to integrated circuits for applications such as high-frequency and high-power.

An FET is a semiconductor device that includes three terminals: a gate, a source, and a drain, Some FETs have a fourth terminal called, the body or substrate, which can be used to bias the transistor. Is addition, for FETs, there are two major operation types known as depletion mode (D-mode) and enhancement mode (E-mode), D-mode transistors operate with zero (or near zero) gate-source voltage when the transistor is in an on-state, for example. E-mode transistors operate with zero (or near zero) gate-source voltage when the transistor is in an off-state, for example.

BRIEF DESCRIPTION OF THE DRAWINGS

FIG. 6A illustrates the structure of FIG. 5A following the formation of a nucleation layer, a doped buffer layer, and a group III-N semiconductor material completely filling the trench, in accordance with an embodiment of the present invention.

FIG. 6B illustrates the structure of FIG. 6A following the formation of a polarization charge inducing layer on the group III-N semiconductor material.

FIG. 6C illustrates the structure of FIG. 6B following a process to thin the polarization charge inducing layer followed by formation of a hardmask and a gate stack.

FIG. 6D illustrates the structure of FIG. 6C following a sequence of process operations to form a vertical group III-N transistor.

FIG. 7A illustrates the structure of FIG. 5G following an extended planarization process to expose the top polarization charge inducing layer.

FIG. 7B illustrates the structure of FIG. 7A following the process of epitaxial growth of a source extension on an exposed uppermost surface of the polarization charge inducing layer.

FIG. 7C illustrates the structure of FIG. 7B following the formation of gate and drain contacts.

FIG. 7D illustrates the structure of FIG. 7C following the formation of a source contact.

FIG. 8A illustrates the structure of FIG. 5C following the formation of a dielectric hardmask layer on the uppermost surface and on a portion of the sidewalls of the polarization charge inducing layer.

FIG. 8B illustrates the structure of FIG. 8A following a process to thin the sidewalls of the polarization charge inducing layer.

FIG. 8C illustrates the structure of FIG. 8B following the formation of a gate stack on the thinned polarization charge inducing layer.

DESCRIPTION OF THE EMBODIMENTS

Figure 1:
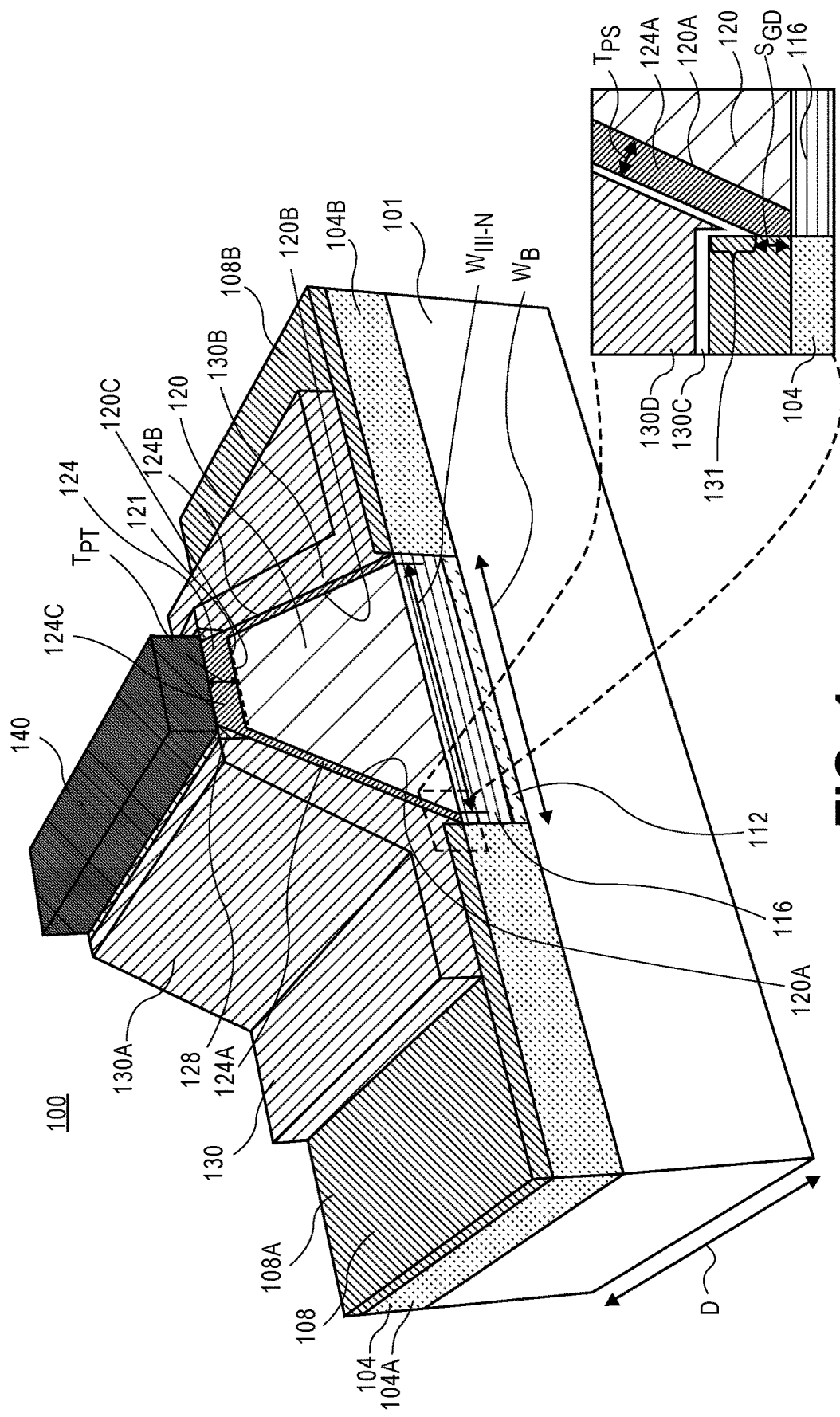
FIG. 1 illustrates an angled cross-sectional view of a vertical group III-N transistor formed on a substrate, in accordance with embodiments of the present invention.

Vertical vertical group III-N transistors for logic, SoC and memory applications and their methods of fabrication are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as enhancement mode operations associated with vertical group III-N transistor, are described in lesser detail in order to not unnecessarily obscure embodiments of the present invention. Furthermore, it is to be understood that the various embodiments shown in the Figures are illustrative representations and are not necessarily drawn to scale.

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

In an embodiment, of the present invention, a vertical group III-N transistor includes a gate fabricated on a thin portion of a polarization charge inducing layer adjacent to and in contact with a sidewall of a group III-N semiconductor material. The vertical group III-N transistor further includes a source contact formed on a thick portion of the polarization charge inducing layer above a top surface of the group III-N semiconductor material and a drain region opposite to the source contact. The thick portion of the polarization charge inducing layer introduces a strain in the top surface of the group III-N semiconductor material creating a 2 dimensional electron gas (2DEG). The thin portion of the polarization charge inducing layer on the sidewall of the group III-N semiconductor material induces strain that is insufficient to create 2DEG in the sidewalls of the group III-N semiconductor material. By biasing the gate of the vertical group III-N transistor, above a threshold voltage, VT, a 2DEG is created in the sidewall of the group III-N semiconductor material. The 2DEG created in the sidewalls of the group III-N semiconductor material enables the vertical group III-N transistor to be operated in an enhancement mode. Enhancement mode operation may offer better voltage transfer characteristic and lower power-delay product of a vertical group III-N transistor. In an embodiment, a vertical group III-N transistor includes an n-doped epitaxial layer on the thick polarization charge inducing layer to reduce contact resistance. In an embodiment, a gate structure is formed on each sidewall of the group III-N semiconductor material to form a pair of vertical group III-N transistors sharing a common source. The pair of vertical transistors may be operated independently or be connected together to provide a single vertical group III-N transistor with increased drive current.

FIG. 1 illustrates an angled cross-sectional view of a vertical group III-N transistor 100 formed on a substrate 101, in accordance with embodiments of the present invention. The vertical group III-N transistor 100 includes a group III-N semiconductor material 120 disposed above a doped buffer layer 116. The doped buffer layer is disposed above the substrate 101. The group III-N semiconductor material 120 has sloped sidewalls 120A, 120B and a flat uppermost surface 120C. A polarization charge inducing layer 124 is disposed on the group III-N semiconductor material 120. The polarization charge inducing layer includes a sidewall polarization charge inducing layer 124A, a sidewall polarization charge inducing layer 124B and a top polarization charge inducing layer 124C. The sidewall polarization charge inducing layers 124A and 124B are disposed on the sloped sidewalls 120A and 120B respectively. The top polarization charge inducing layer 124C is disposed on the flat uppermost surface 120C of the group III-N semiconductor material 120. The top polarization charge inducing layer 124C is substantially thicker than the sidewall polarization charge inducing layers 124A and 124B. The top polarization charge inducing layer 124C has a thickness sufficient to induce strain on the uppermost surface 120C of the group III-N semiconductor material 120. The strain creates a 2DEG (denoted by the dashed line 121) in an uppermost surface 120C of the group III-N semiconductor material 120. The sidewall polarization charge inducing layers 124A and 124B are thin, such that little to no strain is induced on the sidewalls of the group III-N semiconductor material 120A and 120B respectively. The lack or insufficient amount of strain induced in the sloped sidewalls 120A and 120B does not create 2DEG in the sloped sidewalls 120A and 120B of the group III-N semiconductor material 120. A gate structure 130, including a first gate structure 130A and a second gate structure 130B, is disposed on the sidewall polarization charge inducing layers 124A and 124B, respectively. A source contact 140 is disposed on the top polarization charge inducing layer 124C. A source region of the vertical group III-N transistor 100 includes the source contact 140, the top polarization charge inducing layer 124C and the 2DEG. A drain region 104 including a first drain region 104A and a second drain region 104B is disposed on the substrate 101 adjacent to and in contact with sidewalls of the doped buffer layer 116. A dielectric hardmask layer 128 is disposed between a portion of the sidewalls of the polarization charge inducing layer 124 and the gate structure 130 to prevent shorting between the gate structure 130 and source region. The vertical group III-N transistor 100 also includes an insulator layer 108 having a first insulator layer 108A and a second insulator layer 108B, disposed on the first drain region 104A and second drain region 104B respectively.

Referring to FIG. 1, the group III-N semiconductor material 120 is disposed on doped buffer layer 116. In an embodiment, the group III-N semiconductor material 120 does not extend to the edge of the doped buffer layer 116. In one such embodiment, the group III-N semiconductor material 120 is not in contact with sidewalls of the insulator layer 108. In an embodiment, group III-N semiconductor material 120 is lattice matched to the doped buffer layer 116. In an embodiment, the group III-N semiconductor material 120 is a GaN layer. In one such embodiment, the sidewall plane of the GaN layer is a semi-polar-plane (11-22) and the plane of the uppermost surface of GaN layer is a "C" plane (0001). In an embodiment, the group III-N semiconductor material 120 is substantially single crystalline and is referred to herein as "monocrystalline,". In other embodiments, however, low level of crystal defects may be present in group III-N semiconductor material 120. Within the group III-N semiconductor material 120, there is a crystalline arrangement of a first semiconductor material including one or more group III elements and nitrogen. In an embodiment, the group III-N semiconductor material 120 has a relatively high carrier mobility, (greater than 500 cm$^2$ V$^{-1}$). In one such embodiment, the group III-N semiconductor material 120 is a substantially undoped group III-nitride material (i.e., O$_2$ impurity concentration minimized) for minimal impurity scattering. In other embodiments, group III-N semiconductor material 120 includes one or more ternary alloys of GaN, such as AlGaN, AlInN, or a quaternary alloy of GaN including at least one group III element and nitrogen, such as In$_x$Al$_y$Ga$_{1-x-y}$N, where x ranges from 0.01-0.1 and y ranges from 0.01-0.1. In an embodiment, the group III-N semiconductor material 120 has a material thickness approximately in the range of 100 nm-5 um. In an embodiment, the group III-N semiconductor material 120 has a width, W$_{III-N}$, approximately in the range of 100 nm-5 um.

Referring again to FIG. 1, in an embodiment, the polarization charge inducing layer 124 includes a suitable group III-N semiconductor material which induces strain in the group III-N semiconductor material 120. In an embodiment, the polarization charge inducing layer 124 includes a strain inducing material such as but not limited to Al$_z$Ga$_{1-z}$N, Al$_w$In$_{1-w}$N, or AlN, where Z ranges from 0.2-0.3 and W ranges from 0.7-0.85. In an embodiment, the polarization charge inducing layer 124 is AlGaN and the group III-N semiconductor material 120 is GaN. In one such embodiment, the AlGaN polarization charge inducing layer 124 has a bandgap (3.7 eV) that is wider than the bandgap of the GaN group III-N semiconductor material 120 (3.4 eV), facilitating a quantum well at the interface between the AlGaN polarization charge inducing layer 124 and the GaN group III-N semiconductor material 120.

Referring again to FIG. 1, in an embodiment, the top polarization charge inducing layer 124C has a thickness T$_{PT}$, that is substantially thicker than the thickness T$_{PS}$, of the sidewall polarization charge inducing layers 124A and 124B. In an embodiment, the top polarization charge inducing layer 124C has a thickness that is approximately 5-15 times greater than the thickness of the sidewall polarization charge inducing layers 124A and 124B. In an embodiment, the polarization charge inducing layer 124 is an AlGaN. In one such embodiment, the AlGaN top polarization charge inducing layer 124C has a thickness, T$_{PT}$, that is approximately 5-10 times greater than the thickness, T$_{PS}$, of the AlGaN sidewall polarization charge inducing layers 124A and 124B. In one such embodiment, the AlGaN sidewall polarization charge inducing layer has a thickness T$_{PS}$, that is approximately in the range of 1-2 nm. In one such embodiment, the AlGaN top polarization charge inducing layer 124C has a thickness T$_{PT}$, that is approximately in the range of 10 nm-30 nm. In one embodiment an AlGaN polarization charge inducing layer 124 is disposed on a GaN group III-N semiconductor material 120. In one such embodiment, the AlGaN sidewall polarization charge inducing layers 124A and 124B, having a thickness 1 nm-2 nm are disposed on sloped GaN sidewalls 120A and 120B respectively. In one such embodiment, the sloped GaN sidewalls 120A and 120B have a semi-polar-plane (11-22). In one such embodiment, the AlGaN top polarization charge inducing layer 124C, having a thickness 10 nm-30 nm is disposed on a GaN uppermost surface 120C. In one such embodiment, the GaN uppermost surface 120C has a "C" plane (0001).

Referring again to FIG. 1, in an embodiment, the sidewall polarization charge inducing layer 124A includes a bottom portion that is in contact with an uppermost surface of the doped buffer layer 116. In one embodiment the sidewall polarization charge inducing layer 124A is in contact with a portion of the sidewall, S$_{DG}$, of the insulator layer 108A, as is shown in the enhanced cross-sectional illustration of FIG. 1. The portion of the sidewall, S$_{GD}$, is also known as a gate to drain separation distance.

Referring to FIG. 1, a gate structure 130, including a first gate structure 130A and a second gate structure 130B, is disposed on the sidewall polarization charge inducing layers 124A and 124B, respectively. In an embodiment, a portion of the gate structure 130 is disposed on the insulator layer 108. As is depicted in the enhanced cross sectional illustration of FIG. 1, in an embodiment, the gate structure 130A further includes a portion 131 that extends below the uppermost surface of the insulator layer 108A and is disposed between the polarization charge inducing layer 124A and the insulator layer 108A. The gate 130A is separated from the doped buffer layer 116 and the drain region 104A by a distance S$_{GD}$, or gate to drain separation. In an embodiment, the gate to drain separation, S$_{GD}$, determines the breakdown voltage, V$_{BD}$, of the vertical group III-N transistor 100. In an embodiment, the gate structure 130 includes a gate electrode. In an embodiment, the gate structure 130 includes a gate electrode 130D and a gate dielectric 130C. In an embodiment, gate electrode 130D includes a work function metal 130E and a gate cap layer 130F. In an embodiment, the gate dielectric 130C includes a dielectric material such as but not limited to Al$_2$O$_3$, HfO$_2$, ZrO$_2$, TiSiO, HfSiO or Si$_3$N$_4$. In an embodiment, the gate dielectric 130C has a thickness that is approximately in the range of 2 nm-10 nm. In an embodiment, the work function metal 130E includes a metal such as but not limited to Pt, Ni and an alloy such as TiN or TaN. In one such embodiment, the work function metal 130E has a thickness approximately in the range of 10-30 nm. In an embodiment, the gate cap layer 130F includes a metal such as tungsten. In an embodiment, the gate cap layer has a thickness that is approximately in the range of 30-50 nm.

Referring again to FIG. 1, in an embodiment, the doped buffer layer 116 is disposed on a nucleation layer 112. A doped buffer layer enables electrons to flow from gate to drain. In one embodiment, an uppermost surface of the doped buffer layer 116 is coplanar or substantially co-planar with an uppermost surface of the drain region 104. In one such embodiment, maintaining co-planarity between the uppermost surface of the doped buffer layer 116 and the uppermost surface of the drain region 104 helps to prevent shorting between the gate structure 130 and the drain region 104. In an embodiment, the doped buffer layer 116 includes group III-N semiconductor material such as but not limited to GaN or InGaN. In an embodiment, the doped buffer layer 116 includes a dopant material that is an n-type dopant. In one such embodiment, the doped buffer layer 116 includes an n-type dopant material such as but not limited to Si, Ge or Al. In one such embodiment, the n-type dopant material is silicon. In one such embodiment, the n-type dopant is silicon and the silicon n-type dopant has a dopant density that is at least 1e18/cm³. In an embodiment, the doped buffer layer 116 has a thickness approximately in the range of 40-90 nm. In an embodiment, the doped buffer layer 116 has a width, $W_B$, approximately in the range of 100 nm-5 microns.

Referring again to FIG. 1, in an embodiment, the drain region 104 includes a metal such as but not limited to W, Ta, Ni or Ru and their alloys and conductive alloys such as but not limited to TiN or TaN. In an embodiment, the drain region 104 has a thickness approximately in the range of 50 nm-200 nm. In an embodiment, insulator layer 108 includes a dielectric material such as but not limited to silicon nitride, silicon oxide, silicon oxynitride, or carbon doped nitride. In an embodiment, the insulator layer 108 has a thickness approximately in the range of 20 nm-100 nm.

Referring again to FIG. 1, in an embodiment, the dielectric hardmask layer 128 is disposed between gate structure 130 and uppermost portion of the polarization charge inducing layer 124. In one such embodiment, the dielectric hardmask layer 128 provides electrical insulation between the gate structure 130 and the source region. In an embodiment, the dielectric hardmask layer 128 includes a dielectric layer such as but not limited to silicon nitride, carbon doped silicon nitride or a silicon dioxide. In one embodiment, the dielectric hardmask layer 128 has a height that is approximately equal to the height of the top polarization charge inducing layer $T_{PT}$.

Referring to again to FIG. 1, in an embodiment, the source contact 140, is disposed above the upper polarization charge inducing layer 124C. In other embodiments, the source contact may extend beyond the polarization charge including layer 124C, onto a portion of the upper surface of the dielectric hardmask layer 128. In an embodiment, the source contact 140 includes a multi-layer stack. In an embodiment, the multi-layer stack includes layers of two or more distinct metals. In one such embodiment, the multi-layer stack includes a metal or metals such as but not limited to Ti, Al or Ni. In other embodiments, the multi-layer stack includes a metal cap. In one such embodiment, the metal cap includes a conductive material such as but not limited to tungsten or TiN.

In an embodiment, nucleation layer 112 is disposed between the doped buffer layer 116 and the substrate 101 to overcome lattice and thermal mismatch between the substrate 101 and the doped buffer layer 116. In an embodiment, nucleation layer 112 includes AlN. In one such embodiment, the AlN nucleation layer 112 has a thickness approximately in the range of 3 nm-10 nm.

In an embodiment, the substrate 101, housing the vertical group III-N transistor 100 includes a semiconductor material such as but not limited to silicon, silicon germanium (Ge) or silicon carbide (SiC). In one embodiment, the substrate 101 is a silicon substrate. In an embodiment, having a (100) top surface. A silicon substrate 101 with a (100) top surface enables co-integration of silicon CMOS transistor technology with group III-N semiconductor material 120. In a second embodiment of the silicon substrate 101, the silicon semiconductor material has a (110) top surface. In a third embodiment of the silicon substrate 101, the silicon semiconductor material has a (111) top surface. In embodiments, the group III-N semiconductor material 120 and the substrate 101 have lattice mismatch. In an embodiment, the group III-N semiconductor material 120 and the substrate 101 have a lattice mismatch ranging from 15%-50%. In an embodiment, the vertical group III-N transistor 100 includes a silicon substrate 101, a GaN based silicon doped buffer layer 116, a GaN group III-N semiconductor material 120 and an AlGaN polarization charge inducing layer 124.

Figure 2:
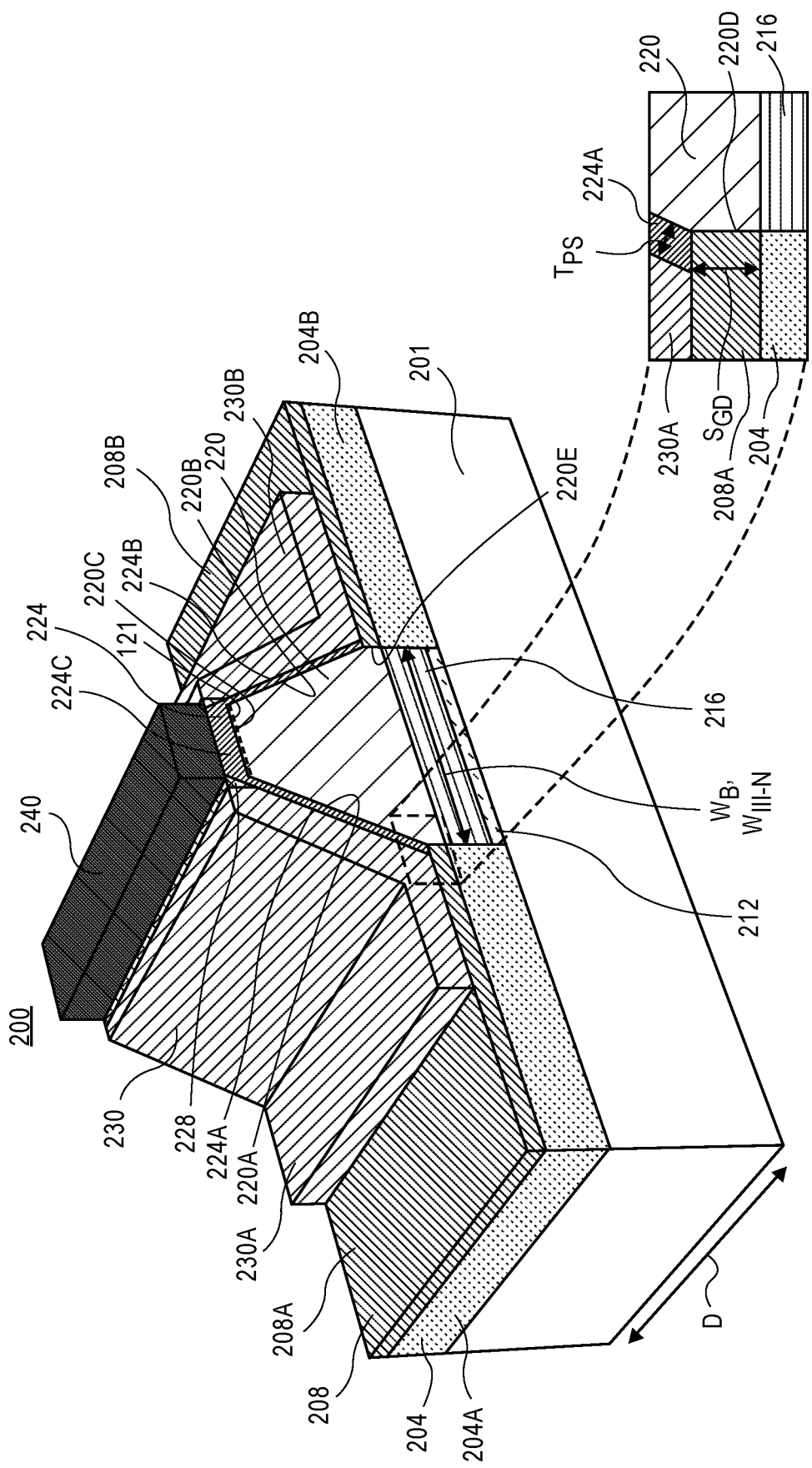
FIG. 2 illustrates an angled cross-sectional view of a vertical group III-N transistor formed on a substrate, in accordance with embodiments of the present invention.

FIG. 2 illustrates an angled cross-sectional view of a vertical group III-N transistor 200 formed on a substrate 201, in accordance with embodiments of the present invention. The vertical group III-N transistor 200 includes a group III-N semiconductor material 220 disposed above a doped buffer layer 216. The doped buffer layer 216 is disposed above a substrate 201. The group III-N semiconductor material 220 has sloped sidewalls 220A, 220B a flat uppermost surface 220C and vertical sidewalls 220D and 220E. A polarization charge inducing layer 224 is disposed on the group III-N semiconductor material 220. The polarization charge inducing layer includes a sidewall polarization charge inducing layer 224A, a sidewall polarization charge inducing layer 224B and a top polarization charge inducing layer 224C. The sidewall polarization charge inducing layers 224A and 224B are disposed on the sloped sidewalls 220A and 220B respectively. A portion of the sidewall polarization charge inducing layers 224A and 224B are also disposed on an uppermost surface of the insulator layer 108A and 108B respectively. The top polarization charge inducing layer 224C is formed on the uppermost surface 220C. There is no polarization charge inducing layer 124 on the vertical sidewalls 220D and 220E of the group III-N semiconductor material 220. The top polarization charge inducing layer 224C has a thickness sufficient to induce strain on the uppermost surface 220C of the group III-N semiconductor material 220. The strain creates a 2DEG (denoted by the dashed line 221) in an uppermost surface 220C of the group III-N semiconductor material 220. The sidewall polarization charge inducing layers 224A and 224B is thin, such that little to no strain is induced on the sloped sidewalls 220A and 220B, respectively of the group III-N semiconductor material 220. The lack or insufficient amount of strain induced in the sloped sidewalls 220A and 220B does not create 2DEG in the sloped sidewalls 220A and 220B of the group III-N semiconductor material 120. The absence of a polarization charge inducing layer 124 adjacent to the vertical sidewalls 220D and 220E prevents formation of a 2DEG layer on the vertical sidewalls 220D and 220E of the group III-N semiconductor material 220. A gate structure 230, including a first gate structure 230A and a second gate structure 230B, is disposed on the sidewall polarization charge inducing layers 224A and 224B, respectively. A source contact 240 is disposed on the flat uppermost surface 220C. A source region of the vertical group III-N transistor 100 includes the source contact 240, the top polarization charge inducing layer 224C and the 2DEG. A drain region 204 including a first drain region 204A and a second drain region 204B is disposed on the substrate 201 adjacent to and in contact with sidewalls of the doped buffer layer 216. A dielectric hardmask layer 228 is disposed between an upper portion of the sidewalls of the polarization charge inducing layer 224 and the gate structure 230. The vertical group III-N transistor also includes an insulator layer 208 having a first insulator layer 208A and a second insulator layer 208B, disposed on the first drain region 204A and second drain region 204B, respectively.

As illustrated in FIG. 2, in an embodiment, the vertical sidewalls 220D and 220E of the group III-N semiconductor material 220 extend to an uppermost surface of the first insulator layer 208A and second insulator layer 208B. In one such embodiment, the sloped sidewalls 220A and 220B originate from an uppermost surface of the insulator layer 208 as is depicted in the enhanced cross-sectional illustration of FIG. 2.

Referring to the enhanced cross-sectional illustration of FIG. 2, in an embodiment, the gate structure 230A does not extend below the uppermost surface of the insulator layer 208A. In one such embodiment, the gate to drain separation distance, $S_{GD}$, is determined by the thickness of the first insulator layer 208A.

In an embodiment, exemplary layer compositions and thicknesses of the nucleation layer 212, doped buffer layer 216, group III-N semiconductor material 220, drain region 204, insulator layer 208, polarization charge inducing layer 224, gate structure 230, dielectric hardmask layer 228 and source contact 240 may be such as described above for nucleation layer 112, doped buffer layer 116, group III-N semiconductor material 120, drain region 104, insulator layer 108, polarization charge inducing layer 124, gate structure 130, dielectric hardmask layer 128 and source contact 140.

Figure 3:
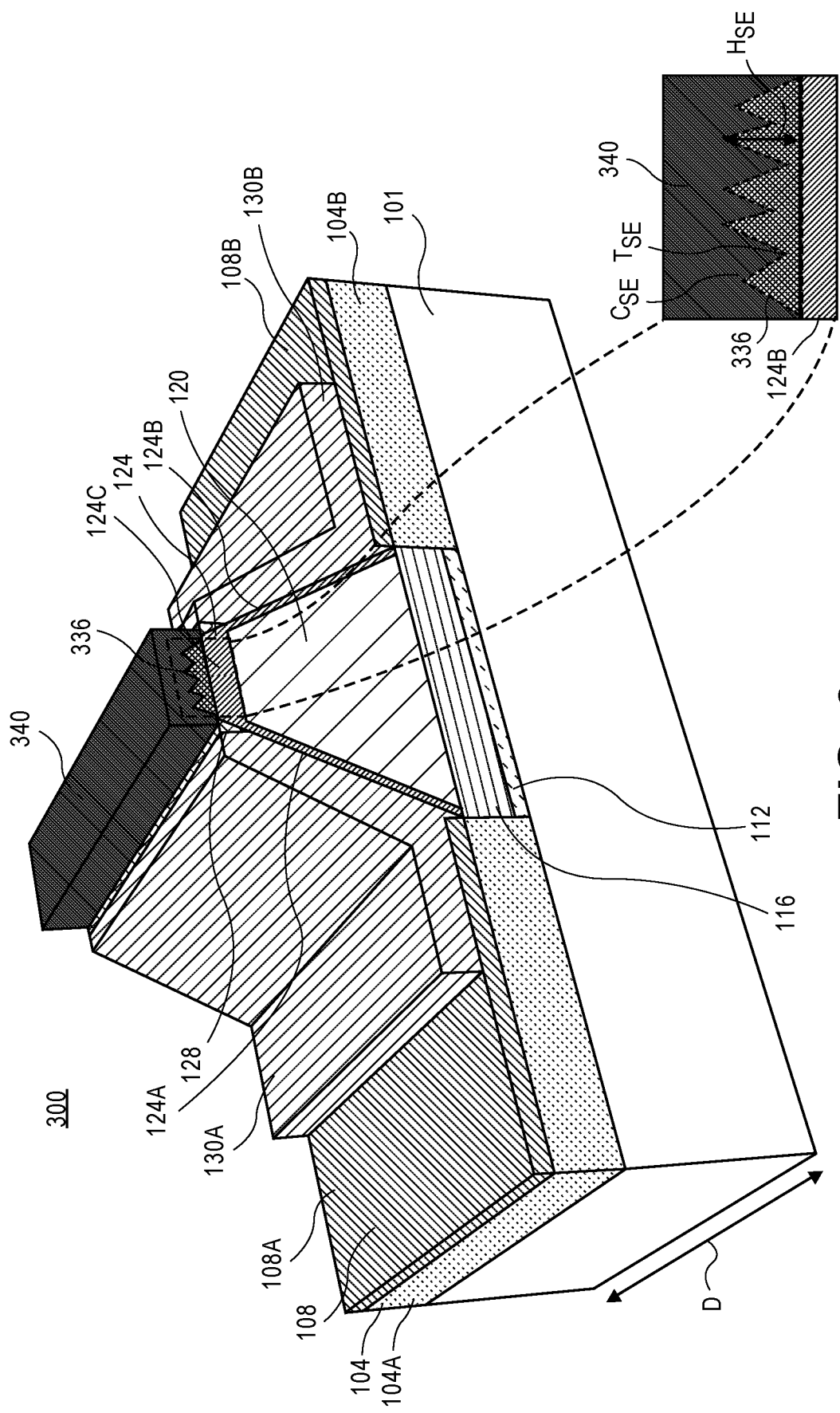
FIG. 3 illustrates an angled cross-sectional view of a vertical group III-N transistor with an epitaxially grown source extension, in accordance with embodiments of the present invention.

FIG. 3 illustrates a vertical group III-N transistor 300 in an accordance with embodiments of the present invention. In an embodiment, the vertical group III-N transistor 300 is a vertical group III-N transistor 100 with a doped source extension 336. Referring to FIG. 3, the doped source extension 336 is disposed between the top polarization charge inducing layer 124C and a source contact 340. The doped source extension 336 laterally extends between the dielectric hardmask layer 128 disposed on each of the two opposing sidewall polarization charge inducing layers 124A and 124B. The doped source extension 336 may help to reduce source contact resistance of the vertical group III-N transistor 300. In an embodiment, the doped source extension 336 reduces the bandgap between the source contact and the top polarization charge inducing layer 224C. The reduced bandgap leads to reduced resistance for the vertical III-N transistor 300.

In an embodiment, the doped source extension 336 is a highly non-uniform layer with crests, $C_{SE}$ and troughs, $T_{SE}$ as is depicted in the enhanced cross sectional illustration of FIG. 3. In one such embodiment, the numerous crests, $C_{SE}$ and troughs, $T_{SE}$, have unequal heights, $H_{SE}$. In an embodiment, the doped source extension 336 is a semiconductor material such as but not limited to GaN or InGaN. In an embodiment, the doped source extension 336 includes a dopant material that is an n-type dopant. The n-type dopant may include materials such as but not limited to Si, Ge or Al. In one embodiment, the n-type dopant material is silicon. In one embodiment, the n-type dopant material has a dopant density that is at least 1e18/cm$^3$. In one such embodiment, the n-type dopant material is silicon having a dopant density that is at least 1e18/cm$^3$. In one embodiment, the doped source extension 336 is a GaN layer. In one such embodiment, the GaN doped source extension 336 layer includes an n-type dopant material. In one such embodiment, the GaN doped source extension 336 layer includes an n-type dopant material that is silicon. In one such embodiment, the GaN doped source extension 336 layer includes an n-type dopant material that is silicon having a dopant density that is at least 1e18/cm$^3$. In an embodiment, doped source extension 336 has a height, $H_{SE}$, approximately in the range of 60-350 nm, which is approximately 1-15 times the thickness of the polarization charge inducing layer 124C. In an embodiment, exemplary layer compositions and thicknesses of the source contact 340 may be such as described above for source contact 140.

Figure 4:
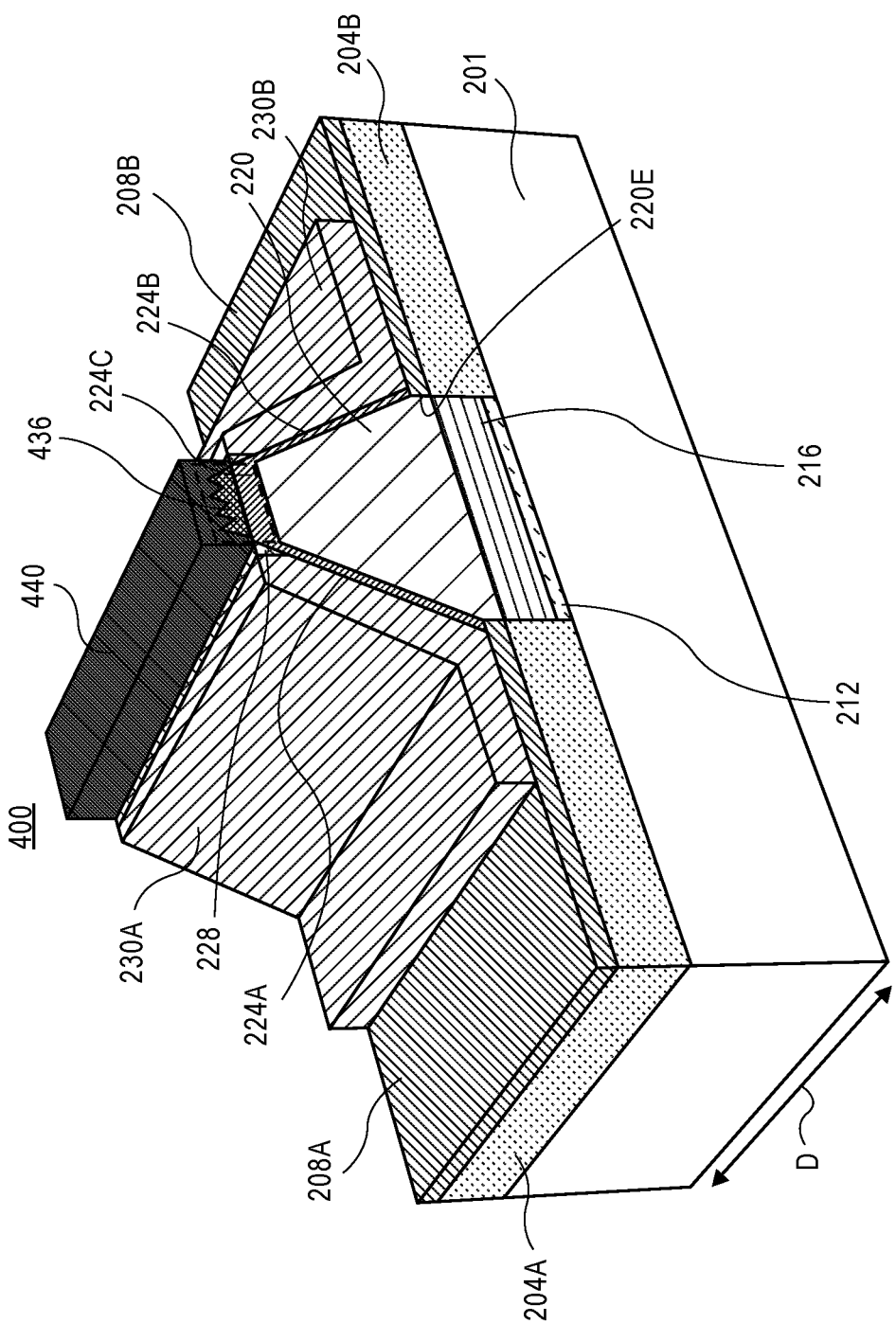
FIG. 4 illustrates an angled cross-sectional view of a vertical group III-N a method of fabricating the vertical group III-N transistor of the structure in FIG. 1, in accordance with embodiments of the present invention.

FIG. 4 illustrates an angled cross-sectional view of a vertical group III-N transistor 400 with an epitaxially grown source extension, in accordance with embodiments of the present invention. Referring to FIG. 4, in an embodiment the vertical group III-N transistor 400 is a rendition of the vertical group III-N transistor 200 (described in association with FIG. 2) with a doped source extension 436. The doped source extension 436 is disposed between the top polarization charge inducing layer 224C and a source contact 440. The doped source extension 436 laterally extends between the dielectric hardmask layer 128 disposed on the two opposing sidewall polarization charge inducing layers 124A and 124B. The doped source extension 436, may help to reduce source contact resistance of the vertical group III-N transistor 400.

In an embodiment, the vertical group III-N transistor 100 includes a single vertical group III-N transistor 100. In one such embodiment, a single vertical group III-N transistor 100 includes a single gate structure 130A that is disposed on the sidewall of polarization charge inducing layer 124A. The sidewall polarization charge inducing layer 124A is disposed on a sloped sidewall of group III-N semiconductor material 120A. The gate structure 130A is separated from the drain region 104A by a single insulator layer 108A. A source contact 140 is disposed on the uppermost surface of the polarization charge inducing layer 124C. In one such embodiment, a masking layer is utilized to prevent connection to gate structure 130B and drain 104B. In another embodiment, vertical group III-N transistor 100 includes two physically distinct gate structures 130A and 130B that are connected together to operate as a singly-gated vertical group III-N transistor.

In an embodiment, exemplary layer compositions and thicknesses of the source contact 440 and doped source extension 436, may be as described above for source contact 140 and doped source extension 336, respectively.

FIGS. 5A-5K illustrate cross-sectional views representing various operations in a method of fabricating an embodiment of the vertical group III-N transistor 100 of the structure in FIG. 1A, in accordance with embodiments of the present invention.

Figure 5A:
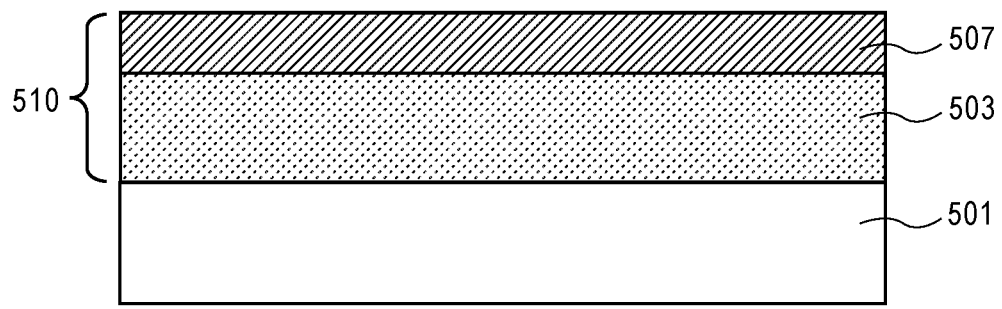
FIG. 5A illustrates a material layer stack formed on a substrate.

FIG. 5A illustrates a material layer stack 510 formed on a substrate 501. In an embodiment, the material layer stack 510 includes a drain layer 503 and an insulator layer 507. In an embodiment, the drain layer 503 is formed on a substrate. In an embodiment, the substrate 501 includes a material such as Si, Ge, or Si—Ge. In an embodiment, the substrate 501 is silicon. In an embodiment, the drain layer 503 is formed on a silicon substrate 501. In an embodiment, the drain layer 503 includes a metal such as but not limited to W or Ru. In an embodiment, the drain layer 503 includes conductive alloys such as but not limited to TiN or TaN. In an embodiment, the drain layer 503 is formed using a physical vapor deposition (PVD) process. In an embodiment, the drain layer 503 has a thickness approximately in the range of 50 nm-200 nm.

Referring again to FIG. 5A, in an embodiment, insulator layer 507 is formed on a drain layer 503. In an embodiment, insulator layer 507 includes a dielectric material such as but not limited to silicon nitride, silicon oxide, silicon oxynitride, or carbon doped nitride. In an embodiment, the insulator layer 507 is formed by a chemical vapor deposition (CVD), or a plasma enhanced chemical vapor deposition (PECVD) process. In an embodiment, the PECVD process has a process temperature ranging from approximately 300-500 degrees Celsius. In an embodiment, the insulator layer 507 has a thickness approximately in the range from 20 nm-100 nm. In an embodiment, the thickness of the insulator layer 507 determines the breakdown voltage, $V_{BD}$ between the gate structure 130 and drain region 104 of the vertical group III-N transistor 100. In an embodiment, the insulator layer 507 has dielectric strength exceeding the dielectric strength of the group III-N semiconductor material 520 to be used in the vertical group III-N transistor 100. In an embodiment, the insulator layer 507 is a silicon dioxide and has a dielectric strength of at least $10^7$V/cm. In one such embodiment, the group III-N semiconductor material 120 is a GaN layer and has a dielectric strength of $3.3 \times 10^6$ V/cm. In an embodiment, the substrate 501 is silicon, the drain layer 503 is TiN and the insulator layer 507 is a silicon nitride.

Figure 5B:
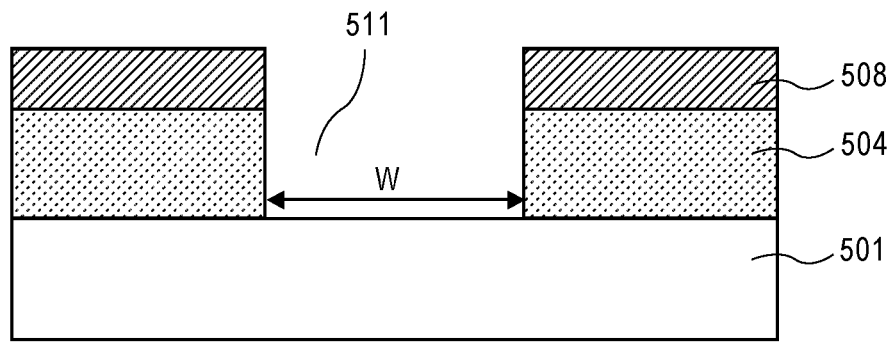
FIG. 5B illustrates the structure of FIG. 5A following the formation of a trench in the material layer stack.

FIG. 5B illustrates the structure of FIG. 5A following the formation of a trench 511 in the material layer stack 510. In an embodiment, prior to forming trench 511, a trench mask is formed on the uppermost surface of the insulator layer 507 (not shown). In an embodiment, a subtractive etch process completely etches the insulator layer 507 and the drain layer 503 from the unmasked regions to form trench 511. In an embodiment, trench 511 has a width, W, approximately in the range of 100 nm-5 microns and a length, L, (into the page in FIG. 5B) approximately ranging from 100 nm-5 microns. Depending on the embodiment, the shape of the trench mask may be square or rectangular. The trench 511 divides the insulator layer 507 into an insulator layer 508 having a first insulator 508A and a second insulator 508B. Similarly, trench 511 divides drain layer 503 into a drain region 504 having a first drain region 504A and a second drain region 504B.

In an embodiment, an anisotropic plasma etch process is used to pattern the drain layer 503 and an insulator layer 507. It is to be appreciated that process gases utilized in the plasma etch process may depend on the materials used for drain layer 503 and insulator layer 507. The insulator layer 507 may be etched by one or more process gases such as $CH_xF_y$, $O_2$, Ar, $N_2$ and $CF_4$. The etch process may further include a process gas of one or more of Ar, $Cl_2$, $CF_4$, $SF_6$, $O_2$ to etch the drain layer 503. Trench 511 may have sidewall angles that are tailored to vary from 85-90 degrees depending on the type of etch conditions employed.

Figure 5C:
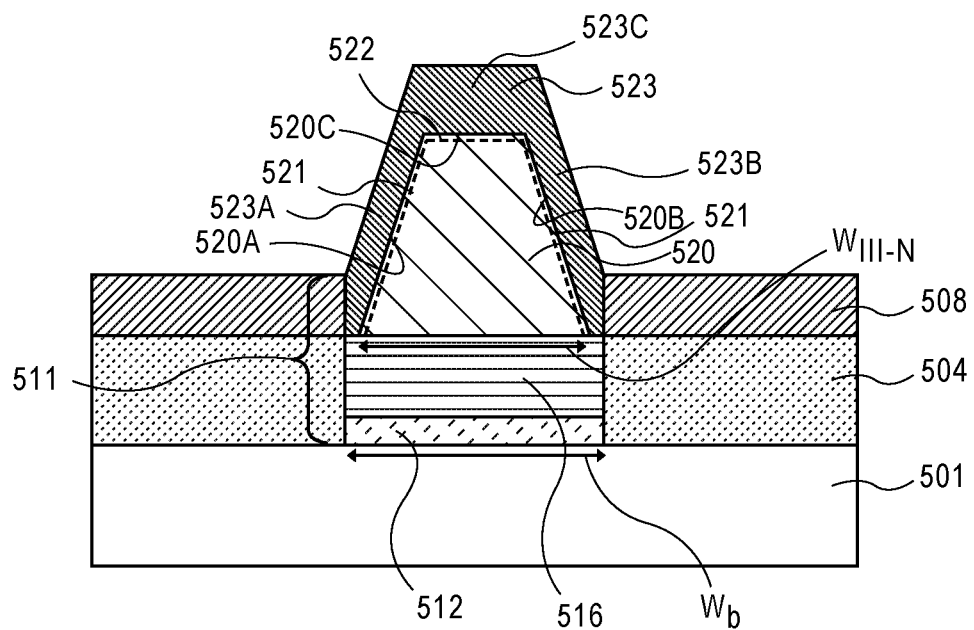
FIG. 5C illustrates the structure of FIG. 5B following the formation of a nucleation layer, a doped buffer layer, a group III-N semiconductor material and a polarization charge inducing layer in the trench, in accordance with an embodiment of the present invention.

FIG. 5C illustrates the structure of FIG. 5B following the formation of a nucleation layer 512, a doped buffer layer 516, a group III-N semiconductor material 520 and a polarization charge inducing layer 524 inside the trench 511 in an accordance with an embodiment of the present invention. In an embodiment, the nucleation layer 512, the doped buffer layer 516, the group semiconductor material 520 and the polarization charge inducing layer 524 are epitaxially formed by a metal organic chemical vapor deposition (MOCVD) process. In one such embodiment, the MOCVD process to form the nucleation layer 512, the doped buffer layer 516 and the group III-N semiconductor material 520 has a process temperature that is approximately in the range of 300-1100 degrees Celsius.

In an embodiment, the nucleation layer 512 minimizes the occurrence of a cracking defect for subsequent group III-N semiconductor material 520 deposition. In an embodiment, the nucleation layer is AlN. In an embodiment, the nucleation layer 512 is AlN and the substrate 501 is silicon. In an embodiment, the AlN nucleation layer 512 has a lattice mismatch with the silicon substrate 501. Depending on the silicon substrate crystal plane orientation, in embodiments, the lattice mismatch between the AlN nucleation layer 512 and the silicon substrate 501 ranges from approximately 15% to 50%. In an embodiment, the nucleation layer 512 is formed in an MOCVD process. In an embodiment, the MOCVD process for forming the nucleation layer 512 has a process temperature that ranges from approximately 300-450 degrees Celsius. In an embodiment, the nucleation layer 512 has a thickness approximately in the range of 10-100 nm.

In embodiment, a doped buffer layer 516 is formed inside the trench 511 and on the nucleation layer 512. In an embodiment, the uppermost surface of the doped buffer layer 516 is coplanar or substantially co-planar with the uppermost surface of the drain region 504. In an embodiment, the doped buffer layer 516 acts as conductive medium for electron to flow from a transistor gate to drain. In an embodiment, exemplary layer compositions and thicknesses of the doped buffer layer 516 may be such as described above for doped buffer layer 116. In an embodiment, the doped buffer layer 116 is formed in an MOCVD process. In an embodiment, the MOCVD process for forming the doped buffer layer 116, has a process temperature that is approximately in the range of 1000-1100 degrees Celsius.

Referring again to FIG. 5C, the group III-N semiconductor material 520 is formed on the doped buffer layer 516. In an embodiment, the group semiconductor material 520 is formed to leave an exposed uppermost surface of the doped buffer layer 516. In an embodiment, as depicted in FIG. 5C, the group III-N semiconductor material 520 has a width, $W_{III-N}$, that is less that the width, $W_B$, of the doped buffer layer 516. Furthermore, in one such embodiment, the group III-N semiconductor material 520 has a base on the nucleation layer 512, that is substantially flat, sidewalls 520A and 520B, that are sloped, and an uppermost surface 520C, that is substantially flat. In an embodiment, sloped sidewalls 520A and 520B have a sidewall angle that is at least 50 degrees. In an embodiment, group III-N semiconductor material 520 is formed using a MOCVD. In an embodiment, the MOCVD process for forming group III-N semiconductor material 520, has a process temperature that is approximately in the range of 1000-1100 degrees Celsius. In an embodiment, the group III-N semiconductor material 520 is a GaN layer. In one such an embodiment, the sloped sidewalls 520A and 520B of the GaN group III-N semiconductor material 520 have a semipolar crystal plane (11-22) and the uppermost surface 520C of the GaN group III-N semiconductor material 520 has a (110-1) orientation.

In an embodiment, when the group III-N semiconductor material 520 is a GaN layer, the uppermost surface 520C and each of the sloped sidewalls 520A and 520B meet at an angle that is less than 130 degrees. In another embodiment, the sloped GaN sidewalls 520A and 520B and the GaN uppermost surface 520C are joined together by a curved GaN surface (not shown). In one such embodiment, the curved GaN surface has an radius of curvature, $R_{c\_GaN}$. In embodiments, the approximate radius of curvature, $R_{c\_GaN}$, varies with the thickness of the GaN layer. In one embodiment, the radius of curvature, $R_{c\_GaN}$, ranges from approximately 400-500 nm for a GaN layer that is approximately in the range of 3 microns-5 microns.

In an embodiment, the group III-N semiconductor material 520 has a thickness approximately in the range of 100 nm-5 micrometers. In an embodiment, group III-N semiconductor material 520 has a defect density less than 1e10/cm2. A film with such a defect density may be described as defect free. In one embodiment, group III-N semiconductor material 520 is formed to a thickness of at least 100 nm to provide a defect free layer.

Referring again to FIG. 5C, the polarization charge inducing layer 523 is formed on the group III-N semiconductor material 520. The polarization charge inducing layer 523 has sidewall polarization charge inducing layers 523A and 523B and a top polarization charge inducing layer 523A. In an embodiment, the sidewall polarization charge inducing layer 523A and 523B formed on the sloped sidewalls 520A and 520B of the group III-N semiconductor material 520 are grown to a different thickness compared to the top polarization charge inducing layer 523C formed on the uppermost surface 520C. In an embodiment, the process condition and materials are chosen such that the polarization charge inducing layer has a growth rate differential where the sidewall polarization charge inducing layers 523A and 523B grow at a slower rate on the sloped sidewalls 520A and 520B, respectively compared to the top polarization charge inducing layer 523C grown on the uppermost surface 520C. In one embodiment, the sidewall polarization charge inducing layers 523A and 523B have a growth rate that is at least 5 times slower than the growth rate of the top polarization charge inducing layer 523C. In an embodiment, the polarization charge inducing layer 523 includes a material such as but not limited to AlN, AlInN or $Al_yGa_{1-y}N$ (where y is 0.24-0.36) and the group III-N semiconductor material includes a material such as but not limited to InGaN or GaN. In an exemplary embodiment, the polarization charge inducing layer 523 includes AlGaN and the group III-N semiconductor material 520 includes GaN. In one such embodiment, the sidewall polarization charge inducing layers 523A and 523B have a growth rate that is at least 10 times slower than the growth rate of the top polarization charge inducing layer 523C. In one such embodiment, the AlGaN sidewall polarization charge inducing layers 523A and 523B is grown to thickness that is approximately in the range of 3 nm-10 nm and the AlGaN top polarization charge inducing layer 523C is grown to a thickness that is approximately in the range of 30 nm-100 nm. Furthermore, in one such embodiment, an AlGaN polarization charge inducing layer 523 having a thickness greater than or equal to approximately 3 nm is sufficiently thick enough to induce a 2DEG effect on the GaN group III-N semiconductor material 520. Consequently, in one such embodiment, a 2DEG is present in the sloped GaN sidewalls 520A and 520B and in the GaN uppermost surface 520C. (indicated by dashed lines 521 and 522).

In a second embodiment, the AlGaN sidewall polarization charge inducing layers 523A and 523B is grown to a thickness that is approximately in the range of 1-2 nm and the top polarization charge inducing layer 523C is grown to a thickness that is approximately in the range of 10-20 nm. Consequently, in one such embodiment, 2DEG is present in the uppermost GaN uppermost surface 520C, but not in the surfaces of the sloped GaN sidewalls 520A and 520B (not shown).

In accordance of an embodiment of the present invention, for the purposes of forming an enhancement mode device, depletion of the 2DEG from the sloped sidewalls 520A and 520B is necessary. In an embodiment, depletion of the 2DEG from the sloped sidewalls 520A and 520B is accomplished by thinning polarization charge inducing layers 523A and 523B. The process of thinning the polarization charge inducing layers 524A and 524B to deplete the 2DEG preferentially may be carried out by a uniform etch back process (as is described in association with FIG. 5D) or carried out through a masking and an etching process (as described in association with FIG. 8).

Figure 5D:
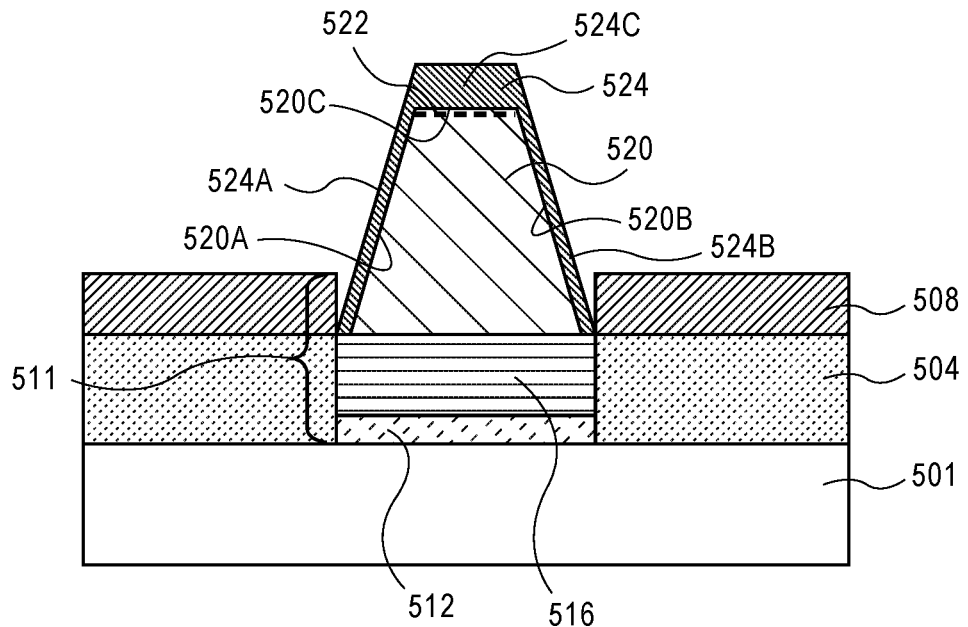
FIG. 5D illustrates the structure of FIG. 5C following a process to thin the polarization charge inducing layer.

FIG. 5D illustrates the structure of FIG. 5C following thinning of the polarization charge inducing layer 523. The polarization charge inducing layer 523 is thinned to provide polarization charge inducing layer 524, having a reduced thickness. In one embodiment, the polarization charge inducing layer 523 is thinned by an isotropic plasma etch process. In one such embodiment, the plasma etch is performed in the absence of a masking layer. In one embodiment, the sidewall polarization charge inducing layers 524A and 524B and the top polarization charge inducing layer 524C are thinned by approximately equal amounts. In an embodiment, the sidewall polarization charge inducing layers 524A and 524B are thinned such that any strain induced on the sloped sidewalls 520A and 520B, respectively do not create 2DEG (absence of dashed line 521 compared to FIG. 5C). In one such embodiment, the top polarization charge inducing layer 524C remains sufficiently thick such that strain induced on the top surface 520 of the group III-N semiconductor material 520 maintains the 2DEG condition (dashed line 522).

In one embodiment, the polarization charge inducing layer 523 is an AlGaN layer. In one such embodiment, the sidewall polarization charge inducing layers 523A and 523B have a thickness that ranges from 3 nm-10 nm and the top polarization charge inducing layer 523C has a thickness that ranges from 30 nm-100 nm. In one such embodiment, the AlGaN sidewall polarization charge inducing layers 523A and 523B are thinned by an amount approximately in the range of 1-9 nm (in order to deplete 2DEG). In one such embodiment, the AlGaN sidewall polarization charge inducing layers 524A and 524B have a thickness that is approximately in the range of 1-2 nm. In one such embodiment, the AlGaN top polarization charge inducing layer 524C has a thickness that is approximately in the range of 21 nm-91 nm.

In one embodiment, the polarization charge inducing layer is grown and then thinned as described above in FIGS. 5B and 5C. The polarization charge inducing layer 523 is first grown to a thickness that provides a uniform and a consistent polarization charge inducing layer 523 on the sidewall of the group III-N semiconductor material 520. The uniform sidewall polarization charge inducing layer 523A and 523B have thicknesses sufficient to create 2DEG and are consequently thinned to deplete the 2DEG.

In an embodiment sidewall polarization charge inducing layers 523A and 523B have sidewalls that are 3 nm-10 nm thick and are subsequently thinned to 1 nm-2 nm to deplete the 2DEG. However, in another embodiment, forming a uniform polarization charge inducing layer 523 results in sidewall polarization charge inducing layers 523A and 523B that are substantially greater than 10 nm leading to 2DEG. In one such embodiment, thinning of the sidewall polarization charge inducing layers 523A and 523B is performed to remove 2DEG.

In another embodiment, the polarization charge inducing layers 523A and 523B are uniformly grown directly to a thickness insufficient to create 2DEG (as is described in an embodiment associated with FIG. 5C). Consequently, the sidewall polarization charge inducing layers 523A and 523B are not thinned after growth. In an embodiment, the sidewall polarization charge inducing layers 523A and 523B and top polarization charge inducing layer 523C are grown to approximately equal thicknesses due to insufficient differential growth conditions, for example. In one such embodiment, the polarization charge inducing layer 523 leads to 2DEG on the sidewalls 520A and 520B and on the uppermost surface 520C of the group III-N semiconductor material 520. In one such embodiment, sidewall polarization charge inducing layers 523A and 523B are preferentially thinned with respect the top polarization charge inducing layer 532C. In an embodiment, a masking method is utilized to preferentially thin the sidewall polarization charge inducing layers 523A and 523B relative to the top polarization charge inducing layer 523C (as is described in association with FIGS. 8A-8B below.).

Figure 5E:
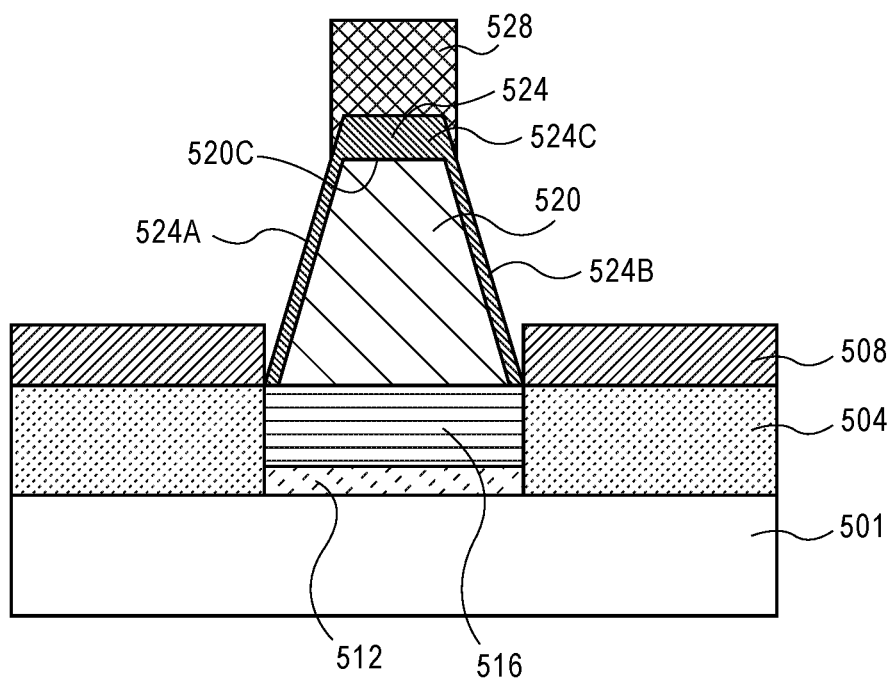
FIG. 5E illustrates the structure of FIG. 5D following the formation of a dielectric hardmask layer on the uppermost surface and on a portion of the sidewalls of the polarization charge inducing layer.

FIG. 5E illustrates the structure of FIG. 5D following the formation of a dielectric hardmask layer 528 on the top polarization charge inducing layer 524C and on portions of the sidewall polarization charge inducing layer 524A and 524B. In one embodiment, the dielectric hardmask layer 528 is formed using a blanket deposition and liftoff removal process. In one such embodiment, a resist mask is formed over the structure of FIG. 5D. In an embodiment, an opening that exposes the top polarization charge inducing layer 524C is formed in the resist layer. A dielectric hardmask layer 528 is formed in the opening on the top polarization charge inducing layer 524C and on portions of the sidewall polarization charge inducing layer 524A and 524B. Subsequently, a resist liftoff process is performed, leaving the dielectric hardmask layer 528 in the opening. Other process embodiments include blanket deposition, masking and etching of the dielectric hardmask layer 528 on the structure of FIG. 5D (not shown).

Referring to FIG. 5E, in an embodiment, the dielectric hardmask layer 528 has a lowermost portion that is approximately at the same level as the level of the uppermost surface 520C of the group semiconductor material 520. Suitable materials for forming dielectric hardmask layer 528 may include an insulator material such as but not limited to silicon nitride, carbon dope silicon nitride, silicon dioxide or silicon oxynitride.

Figure 5F:
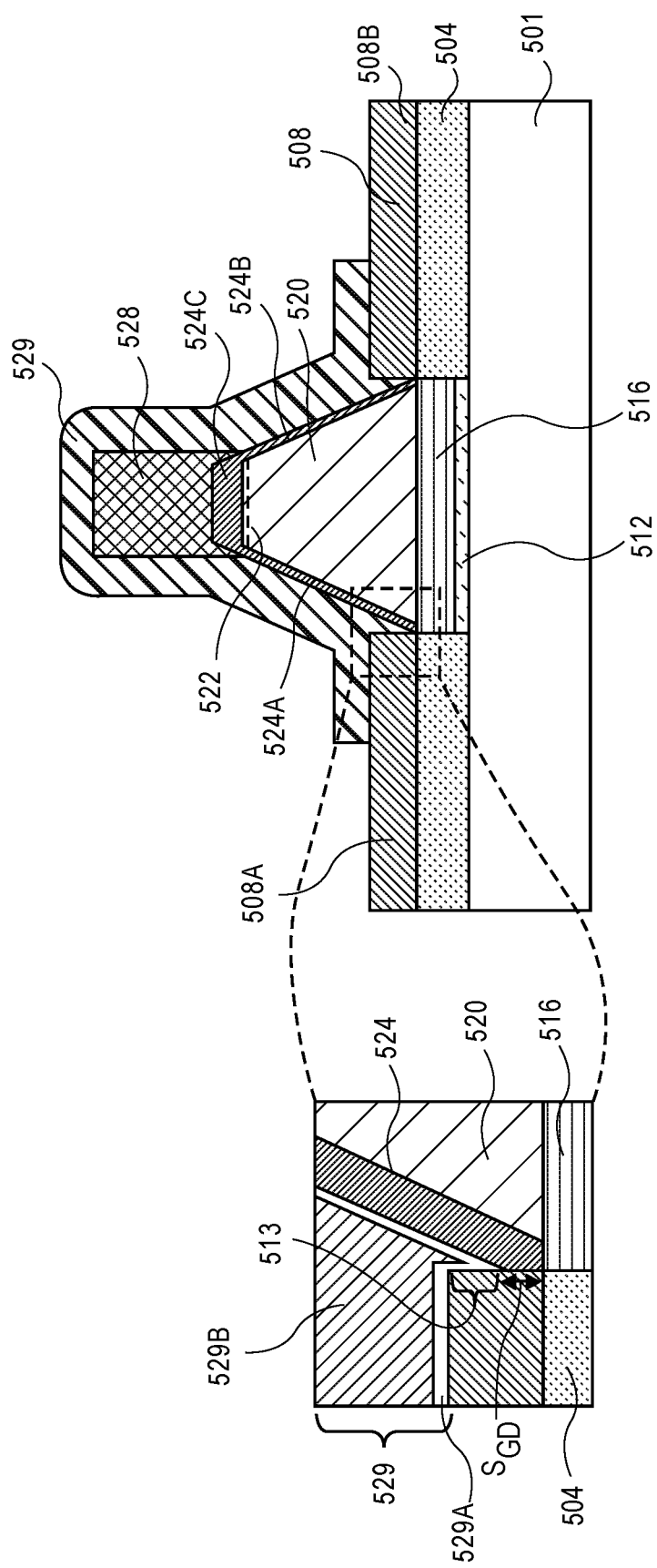
FIG. 5F illustrates the structure of FIG. 5E following the formation of a gate stack, in accordance with an embodiment of the present invention.

FIG. 5F illustrates the structure of FIG. 5E following the formation of a gate stack 529 in accordance with an embodiment of the present invention. In an embodiment, the gate stack 529 may be formed by a blanket deposition process, and then followed by a patterning process. In an embodiment, gate stack 529 is formed over the insulator layer 508, on the sidewalls of the polarization charge inducing layers 524A and 524B and over the dielectric hardmask layer 528. In an embodiment, the gate stack 529 further includes a portion 513 that extends below the uppermost surface of the insulator 508. In an embodiment, the gate stack 529 includes a gate electrode 529B. As illustrated in the enhanced cross sectional illustration of FIG. 5F, in an embodiment, the gate stack 529 includes a gate dielectric layer 529A and a gate electrode 529B. In an embodiment, gate electrode 529B includes a work function metal and a gate cap layer (not shown). Suitable materials for the forming a gate dielectric layer 529A include dielectric materials such as but not limited to $Al_2O_3$, $HfO_2$, $ZrO_2$, TiSiO, HfSiO or $Si_3N_4$. In an embodiment, the gate dielectric layer 529A, is formed by an atomic layer deposition (ALD) process. In an embodiment, the gate dielectric layer 529A has a thickness approximately in the range of 2 nm-10 nm. Suitable materials for the forming a gate electrode 529B includes conductive materials such as but not limited to Pt, Ni or TiN. In an embodiment, the gate electrode may be formed by an ALD process or a physical vapor deposition (PVD) process. In an embodiment, the gate electrode 529B has a thickness approximately in the range of 10 nm-30 nm. In an embodiment, when the gate electrode 529B includes a work function metal as well as a conductive cap metal, the work function metal includes conductive materials such as but not limited to Pt, Ni or TiN. In one such embodiment, the conductive cap metal includes a metal such as tungsten. In one such embodiment, when the gate electrode 529B includes a conductive cap metal, the gate electrode 529B has a thickness approximately in the range of 60 nm-80 nm.

Subsequent to the gate stack 529 deposition process, a resist mask is formed on the gate mask (not shown). The exposed portions of the gate stack 529 is then plasma etched. In an embodiment, the gate stack 529 is formed on a portion of the insulator layer 508, on the sidewall polarization charge inducing layers 524A and 524B and on the dielectric hardmask layer 528. The resist mask is removed post plasma etching.

Figure 5G:
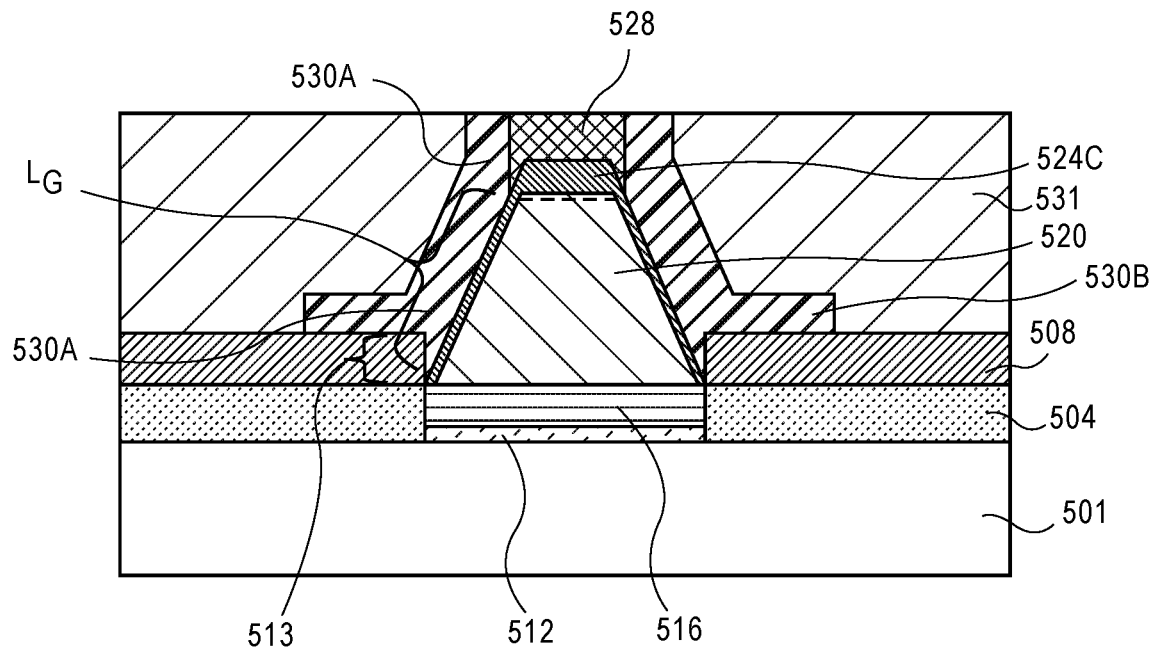
FIG. 5G illustrates the structure of FIG. 5F following the formation of a gate structure.

FIG. 5G illustrates the structure of FIG. 5F following the formation of a gate structure 530. In a process embodiment, a dielectric layer 531 is formed on the uppermost surface of the insulator layer 508 and on the gate stack 529 and a planarization process is subsequently performed. In an embodiment, dielectric layer 531 includes materials such as, but not limited to silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The dielectric layer 531 may include pores or air gaps to further reduce their dielectric constant. Embodiments of dielectric layer 531 may be formed by a variety of deposition techniques included but not limited to plasma enhanced chemical vapor deposition (PECVD), chemical vapor deposition (CVD) or vertical diffusion furnace (VDF). In an embodiment, dielectric layer 531 has a thickness approximately in the range of 5000 A-100000 A.

In an embodiment, a chemical mechanical polishing (CMP) process is used for the planarizing process. The CMP process removes portions of the dielectric layer 531, a portion of the gate stack 529, and a portion of the dielectric hardmask layer 528. In an embodiment, as is depicted in FIG. 5G, gate structure 530, including a first gate structure 530A and a second gate structure 530B is formed on the sidewall polarization charge inducing layers 524A and 524B, respectively. In an embodiment, the gate structure 530 has a portion that is in contact with the sidewalls of polarization charge inducing layer 524. In an embodiment, the portion of the gate structure 530 in direct contact with the sidewall polarization charge inducing layers 524A and 524B, is characterized as a gate length, $L_G$, of a vertical group III-N transistor. In an embodiment, the gate structure 530 has a gate length, $L_G$, that ranges from approximately 100 nm-5 microns. Furthermore, in one such embodiment, gate structure 530 has a portion 513 that extends below the uppermost surface of the insulator 508. The gate structure 530 is separated from the doped buffer layer 516 and the drain region 504 by a distance $S_{GD}$, or gate to drain separation. In an embodiment, the gate to drain separation, $S_{GD}$, determines the breakdown voltage, $V_{BD}$, of a vertical group III-N transistor.

In an embodiment, the first and second gate structures 530A and 530B, the dielectric hardmask layer 528 and the dielectric layer 531 have uppermost surfaces that that are coplanar or substantially coplanar with one another. In other embodiments, the uppermost surface of the gate structure 530 may be recessed below a level of an uppermost surface of the top polarization charge inducing layer 524C.

Figure 5H:
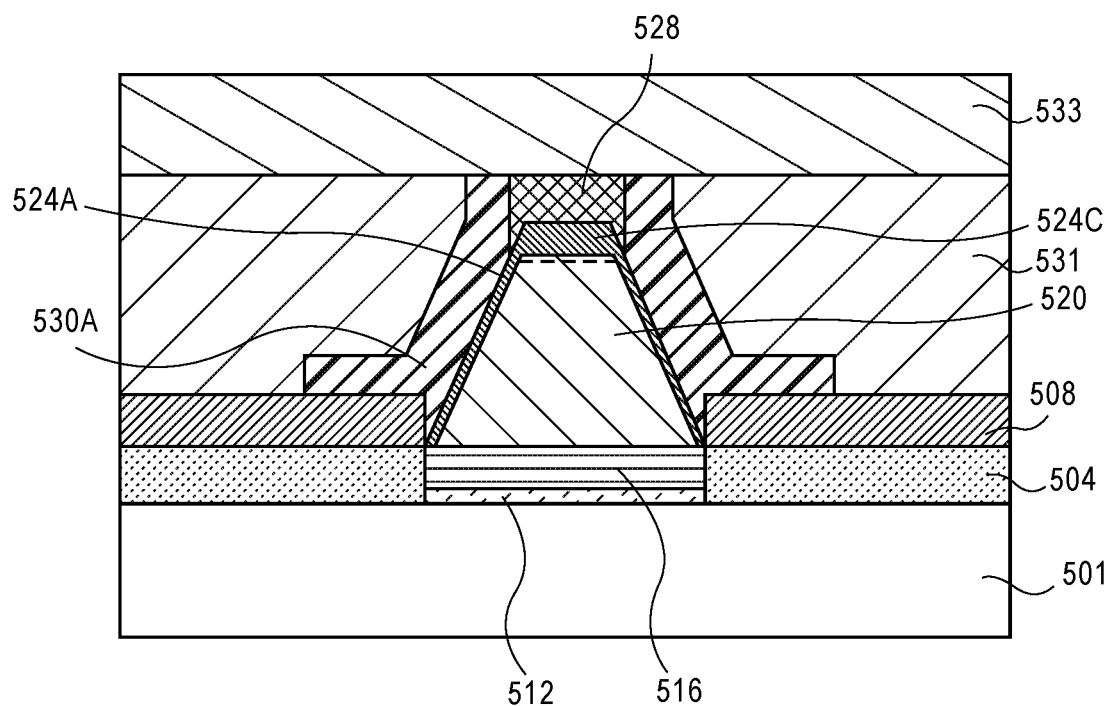
FIG. 5H illustrates the structure of FIG. 5G following the formation of a second dielectric layer.

FIG. 5H illustrates the structure of FIG. 5G following the formation of a second dielectric layer 533 on the uppermost surface of the dielectric layer 531, on the uppermost surface gate structure 530 and on the uppermost surface of the dielectric hardmask layer 528. Suitable materials and methods for the forming a second dielectric layer 533 include materials and methods such as is described above in association with forming dielectric layer 531. In an embodiment, the second dielectric layer 533 has a thickness ranging from 50 nm-200 nm.

Figure 5I:
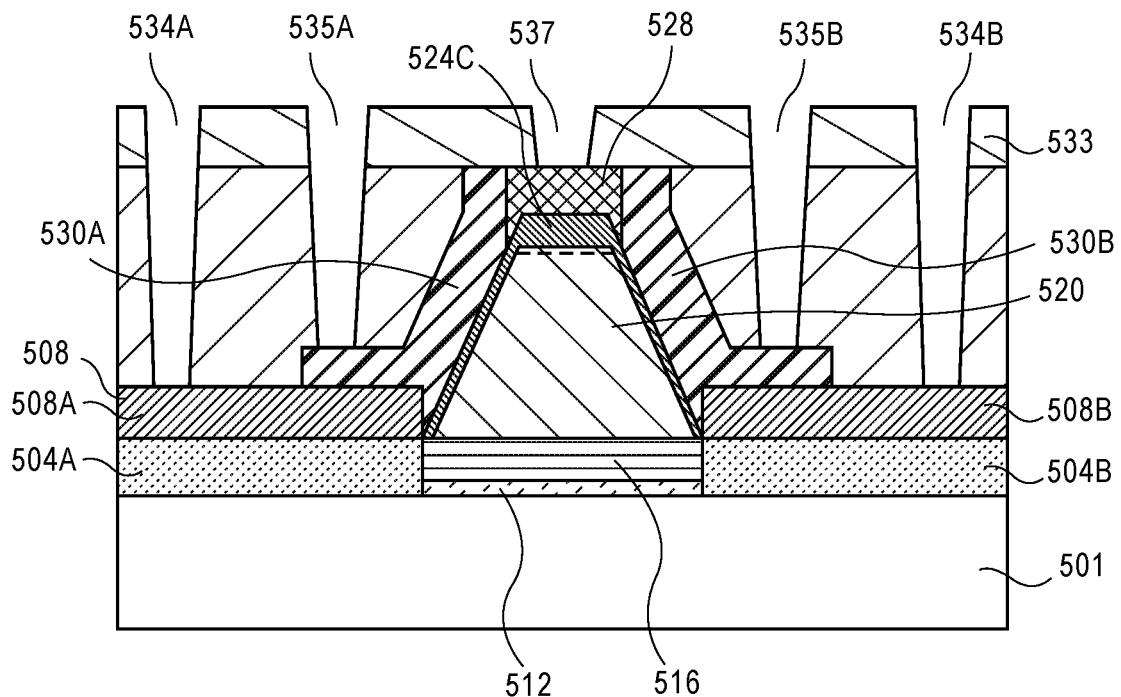
FIG. 5I illustrates the structure of FIG. 5H following a first etch process to form via openings in the dielectric layers.

FIG. 5I illustrates the structure of FIG. 5H following a first of a two-step etch process to form via openings 534A, 534B, 537, 535A and 535B in the dielectric layer 531 and second dielectric layer 533. In a process embodiment, a plurality of via openings is defined using a lithographic process (not shown), followed by a first etch process. In an embodiment, the via openings are etched using a reactive ion etch with chemistry including $CF_X$, $CH_XF_Y$, CO, $O_2$ and Ar. In an embodiment, as is depicted in FIG. 5I, the via openings 534A and 534B expose the first and second insulator 508A and 508B respectively. In one such embodiment, via openings 535A and 535B expose the first and second gate structures 530A and 530B, respectively. Furthermore, in one such embodiment, via opening 537 exposes an uppermost surface of the dielectric hardmask layer 528.

In an embodiment, the via openings 534A, 534B, 535A, 535B and 537 have widths ranging from 30-200 nm. In different embodiments, the via openings may be circular, elliptical or rectangular. In an embodiment, the first etch process forms the tallest via openings 534A and 534B but does not etch through the dielectric hardmask layer 528 or the insulator layer 508. In one embodiment, the dielectric material utilized for dielectric layer 531 and second dielectric layer 533 is silicon dioxide and the dielectric material used for insulator layer 508 and dielectric hardmask layer 528 is a silicon nitride. In one such embodiment, when using an etch process includes gases such as but not limited to $CH_XF_Y$, CO, $O_2$ and Ar, the dielectric layer 531 and second dielectric layer 533 have an etch selectivity to the dielectric hardmask layer 528 and insulator layer 508 that is approximately 10:1.

Figure 5J:
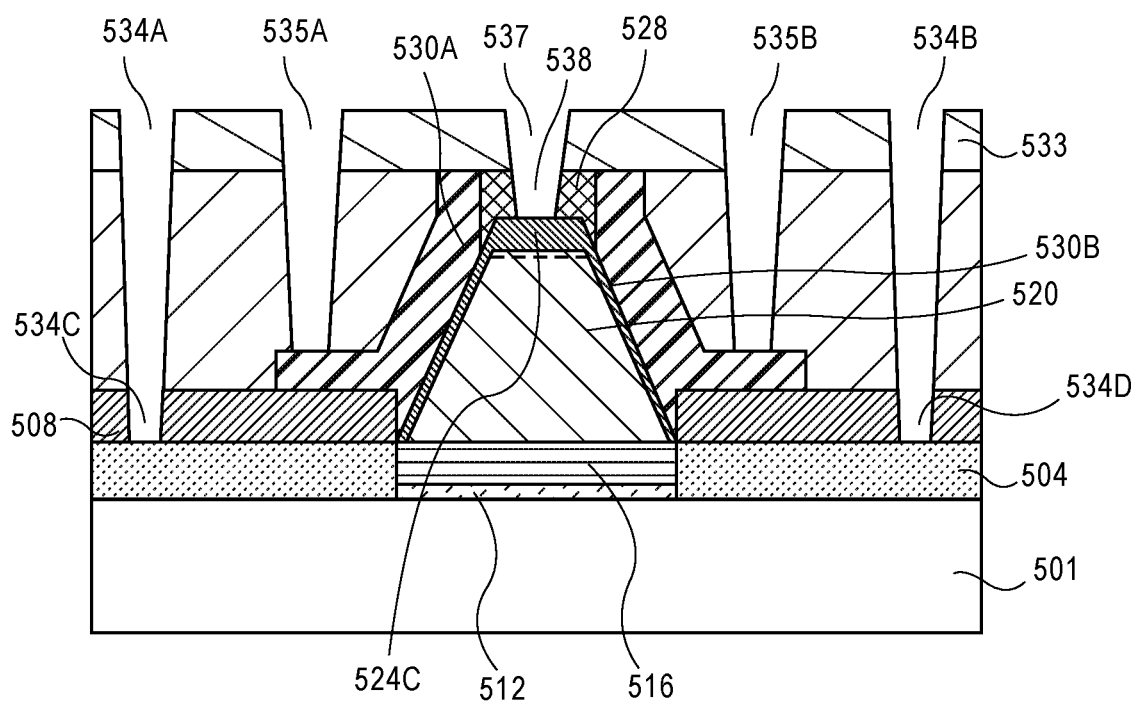
FIG. 5J illustrates the structure of FIG. 5I following a second etch process to form an opening to expose the uppermost surface of the polarization charge inducing layer and the drain regions.

FIG. 5J illustrates the structure of FIG. 5I following a second etch process to form a via opening 538 to expose the uppermost surface of the polarization charge inducing layer 524C and the first and second drain region 504A and 504B. In a process embodiment, via openings 537, 534A and 534B are subjected to a second plasma etch process to form via openings 538, 534C and 534D, respectively. In an embodiment, the etch process utilizes a reactive ion etch with chemistry including $CF_X$, $CH_XF_Y$, $O_2$, $N_2$ and Ar. In one embodiment, the dielectric material utilized for dielectric layer 531 and second dielectric layer 533 is silicon dioxide and the dielectric material used for insulator layer 508 and dielectric hardmask layer 528 is a silicon nitride. In one such embodiment, when using an etch process includes gases such as but not limited to $CF_X$, $CH_XF_Y$, $O_2$, $N_2$ and Ar, the dielectric hardmask layer 528 and insulator layer 508 have an etch selectivity to the dielectric layer 531 and second dielectric layer 533 that is approximately 3:1.

In one such embodiment, via opening 538 exposes the uppermost surface of the top polarization charge inducing layer 524C. In one such embodiment via openings 534C and 534D expose the first and second drain regions 504A and 504B, respectively. It is to be appreciated that portions of the gate structure 530 exposed by via openings 535A and 535B may be recessed during the second etch process carried out to form via openings 538, 534C and 534D. In an embodiment, the conductive cap layer of the gate structure 530 is tungsten. In one such embodiment, when etching with process gases that include fluorine, the gate structure 530 is recessed by 2 nm-5 nm in portions exposed by via openings 535A and 535B.

Figure 5K:
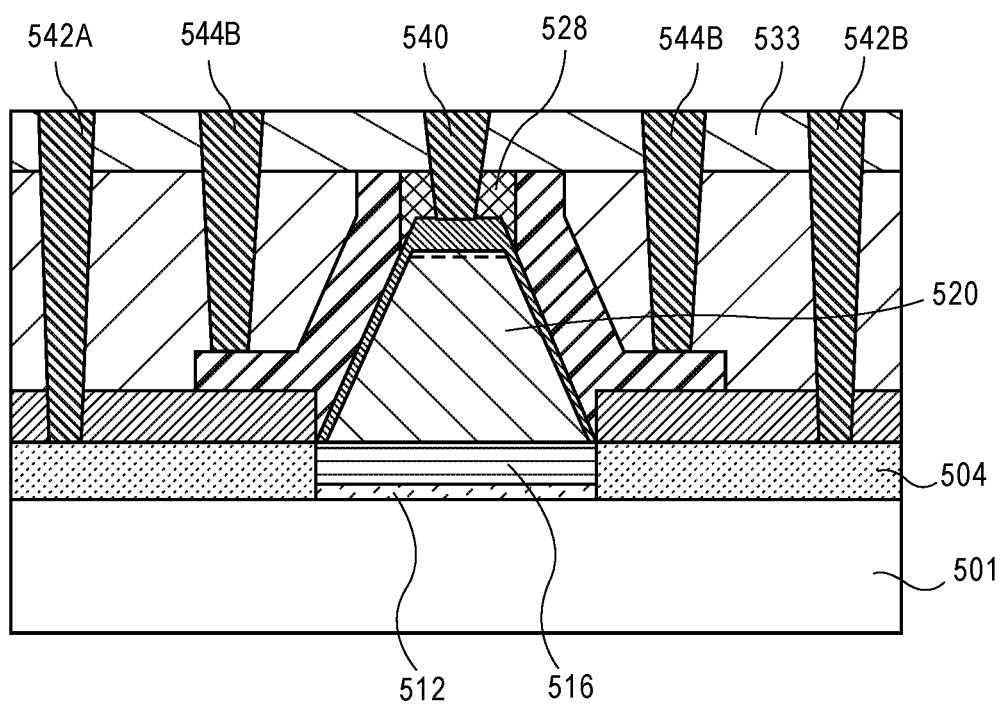
FIG. 5K illustrates the structure of FIG. 5J following the formation of gate, drain and source contacts.

FIG. 5K illustrates the structure of FIG. 5J following the formation of a first and second gate contact 544A and 544B respectively, first and second drain contacts 542A and 542B respectively, and a source contact 540. In an embodiment, one or more metals are formed inside each of the via openings 537, 538, 534A, 534B, 534C, 534D, 535A and 535B and on the uppermost layer of the dielectric layer 533. In an embodiment, materials used for forming contacts include metals such as but not limited to Ti, Al or Ni. In an embodiment, the thickness of the metals used to form contacts range from 10-30 nm. Subsequently, a planarization process is carried out to remove the one or more metal layers from the uppermost surface of the dielectric layer 533. In one embodiment, the planarization process includes a chemical mechanical polish (CMP) process. In an embodiment, the structure of FIG. 5K undergoes an annealing process. In an embodiment, the annealing process has a process temperature ranging from approximately 500-600 degrees Celsius. In an embodiment, the annealing process leads to diffusion of the nitride.

FIGS. 6A-6D illustrate cross-sectional views representing various operations in a method of fabricating a vertical group III-N transistor 200 of the structure in FIG. 2A, in accordance with embodiments of the present invention.

Figure 6A:
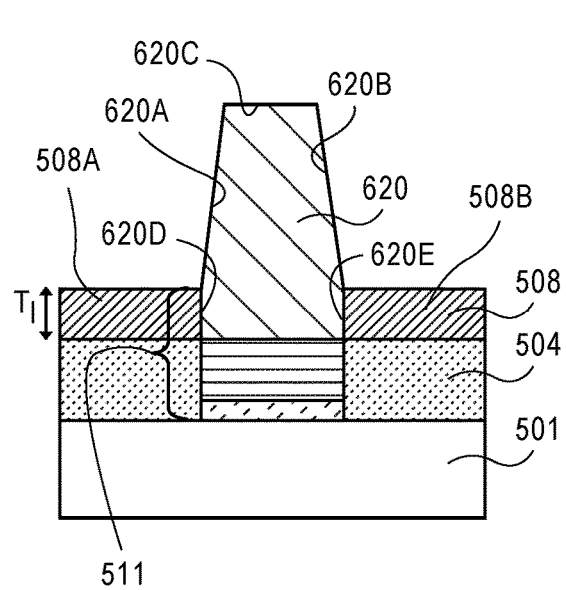
FIGS. 6A-6D illustrate cross-sectional views representing various operations in a method of fabricating the vertical group III-N transistor of the structure in FIG. 2, in accordance with embodiments of the present invention.

FIG. 6A illustrates the structure of FIG. 5B following the formation of a nucleation layer 512, a doped buffer layer 516, and a group III-N semiconductor material 620 in the trench 511. In one such embodiment, the group III-N semiconductor material 620 has sloped sidewalls 620A and 620B, a flat uppermost surface 620C and vertical sidewalls 620D and 620E. In an embodiment, vertical sidewalls 620D and 620E are formed adjacent to and in direct contact with the first and second insulator 508A and 508B, respectively as is depicted in FIG. 6A. In an embodiment, the sloped sidewalls 620A and 620B originate from an edge region of the uppermost portion of the insulator layer 508.

Exemplary layer composition, crystal plane orientation, thickness and method of forming the group III-N semiconductor material 620 may be as described above for group III-N semiconductor material 520. In one embodiment, the vertical sidewalls 620D and 620E have a height that is approximately equal to the thickness, $T_I$, of the insulator layer 508. In one such embodiment, the vertical sidewalls 620D and 620E have a height that approximately ranges from 20 nm-100 nm. In other embodiments, the vertical sidewalls 620D and 620E have a height that is less than the thickness, $T_I$, of the insulator layer 508. In one such embodiment, vertical sidewalls 620D and 620E have a height that is approximately 5%-50% of the thickness $T_I$, of the insulator layer 508.

In an embodiment, the group III-N semiconductor material 620 is GaN. In one such embodiment, the GaN group III-N semiconductor material 620 has sloped sidewalls 620A and 620B which have a (11-22) sidewall plane orientation and an uppermost surface 620C which has a C plane with (110-1) orientation.

Figure 12:
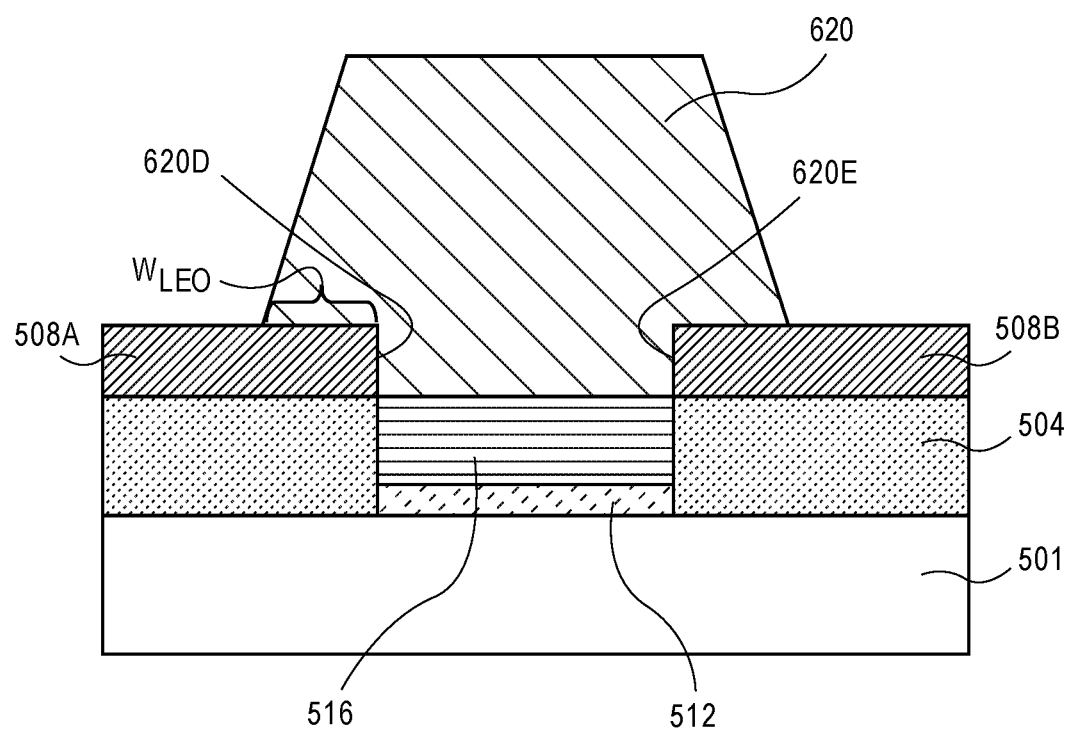
FIG. 12 illustrates the structure of FIG. 6A following the formation of a lateral epitaxial overgrowth of the group III-N semiconductor material.

In another embodiment, the group III-N semiconductor material 620 is formed in a manner that extends the group III-N semiconductor material 620 on to a portion 650 of the uppermost surface of the insulator layer 508, as shown in FIG. 12. In one such embodiment, the portion of the group III-N semiconductor material 620, that extends over the surface of the insulator layer 508 has a width, $W_{LEO}$. In an embodiment, the width $W_{LEO}$, ranges from 100 nm-500 nm.

Figure 6B:
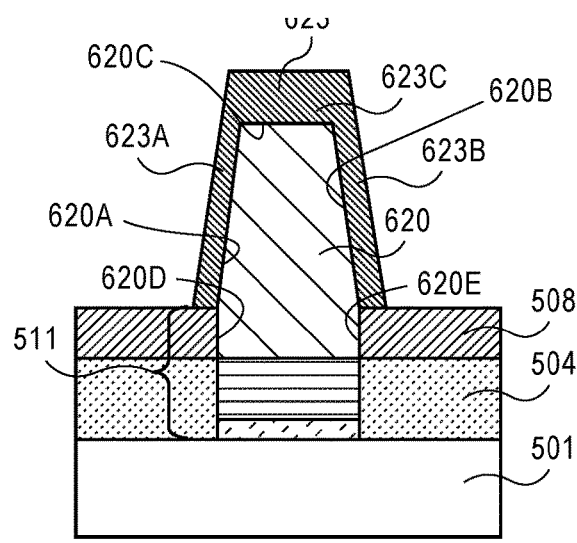

FIG. 6B illustrates the structure of FIG. 6A following the formation of a polarization charge inducing layer 623 on the group III-N semiconductor material 620. In an embodiment, the polarization charge inducing layer 623 includes sidewall polarization charge inducing layers 623A and 623B and a top polarization charge inducing layer 623C. In an embodiment, the sidewall polarization charge inducing layers 623A and 623B are formed on the sloped sidewalls 620A and 620B respectively. In one such embodiment, the top polarization charge inducing layer 623C is formed on the flat uppermost surface 620C. In one embodiment, polarization charge inducing layer 624 is not present on surfaces of the vertical sidewalls 620D and 620E. Suitable materials, thicknesses and methods for forming a polarization charge inducing layer 623 include materials, thicknesses and methods such as described above in association with forming polarization charge inducing layer 523.

Figure 6C:
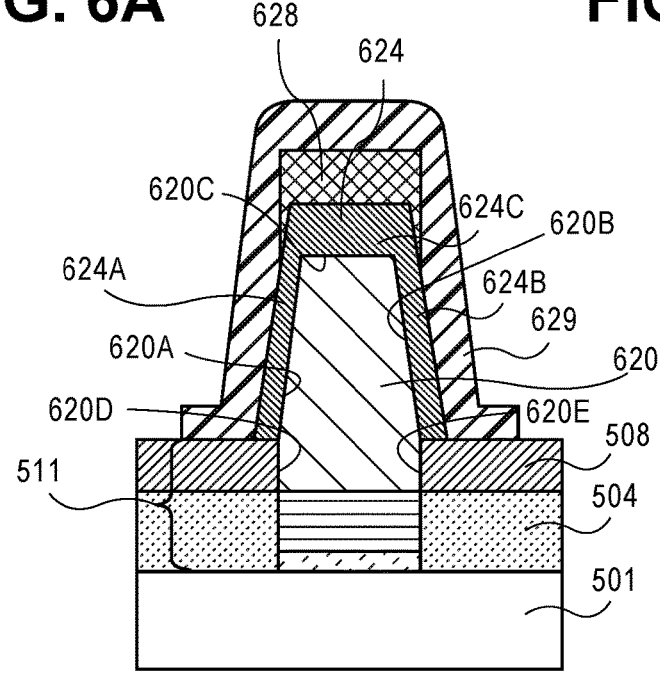

FIG. 6C illustrates the structure of FIG. 6B following thinning of the polarization charge inducing layer 623, followed by formation of a hardmask and a gate stack. In an embodiment, a suitable method to thin the polarization charge inducing layer 623 to form a polarization charge inducing layer 624, having thinned sidewalls includes a process such as plasma etch. In an embodiment, exemplary thicknesses of the sidewall polarization charge inducing layers 624A and 624B and top polarization charge inducing layer 624C are such as is described above in association with the sidewall polarization charge inducing layers 224A and 224B and the top polarization charge inducing layer 224C.

In an embodiment, suitable materials, thicknesses and methods for forming a dielectric hardmask layer 628 include materials, thicknesses and methods such as described above in association with dielectric hardmask layer 528.

In an embodiment, suitable materials, thicknesses and methods for forming a gate stack 629 include materials, thicknesses and methods such as is described above in association with forming gate stack 529. In an embodiment, the gate stack 629 extends over a portion of the insulator layer 508. In an embodiment, as illustrated in FIG. 6C, the gate stack 629 is not formed adjacent to the insulator layer 508 inside trench 511.

Figure 6D:
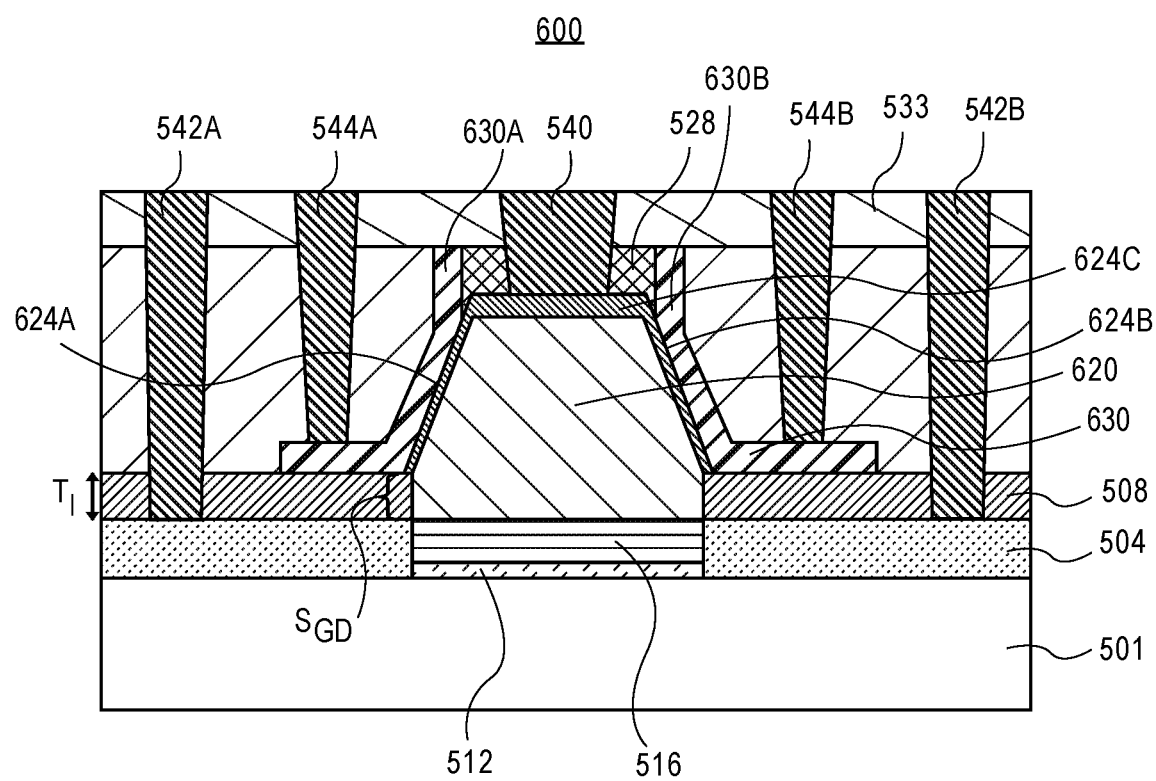

FIG. 6D illustrates the structure of FIG. 6C following a series of process operations to form a vertical group III-N transistor 600. In an embodiment, the sequence of process operations to form vertical group III-N transistor 600 beginning with the structure of FIG. 6C is comparable to the sequence of process operations described in association with FIGS. 5G-5K. The structure of FIG. 6D is a vertical group III-N transistor 600.

In an embodiment, the vertical group III-N transistor 600 has a gate to drain separation, $S_{GD}$ as in illustrated in FIG. 6D. In an embodiment, the gate to drain separation, $S_{GD}$, determines the breakdown voltage, $V_{BD}$, between the gate structure 630 and drain layer 504. In one such embodiment the gate to drain separation, $S_{GD}$, is determined entirely by the thickness $T_I$ of the insulator layer 508. In one such embodiment, the vertical group III-N transistor 200 has a breakdown voltage, $V_{BD}$, that is determined by the thickness of the insulator layer 508. In an embodiment, vertical group III-N transistor 600 has a breakdown voltage, $V_{BD}$, that is in the range of 3V-20V.

FIG. 7A-7D illustrate cross-sectional views representing various operations in a method of fabricating a vertical group III-N transistor of the structure in FIG. 3, in accordance with embodiments of the present invention.

Figure 7A:
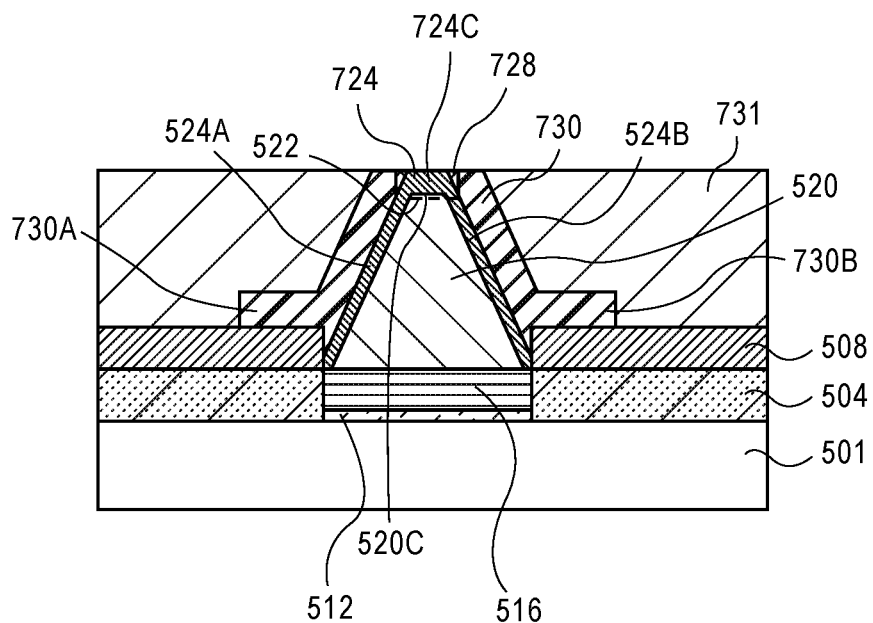
FIG. 7A-7D illustrate cross-sectional views representing various operations in a method of fabricating the vertical group III-N transistor of the structure in FIG. 3, in accordance with an embodiment of the present invention.

FIG. 7A illustrates the structure of FIG. 5G following an extended planarization process. In an embodiment, the extended planarization process removes all the dielectric hardmask layer 528 from above the top polarization charge inducing layer 524C. However, the planarization process leaves remnants of the dielectric hardmask layer 528 on the sidewall polarization charge inducing layer 524A and 524B. In one such embodiment, top polarization charge inducing layer 724C is completely exposed as a result of the extended planarization process. In one such embodiment, 0%-50% of the top polarization charge inducing layer (FIG. 5H) is removed during the planarizing process. In an embodiment, the polarization charge inducing layer 724C is sufficiently thick to create 2DEG. In an embodiment, the polarization charge inducing layer 724C has a resulting thickness that is approximately in the range of 15 nm-50 nm.

Figure 7B:
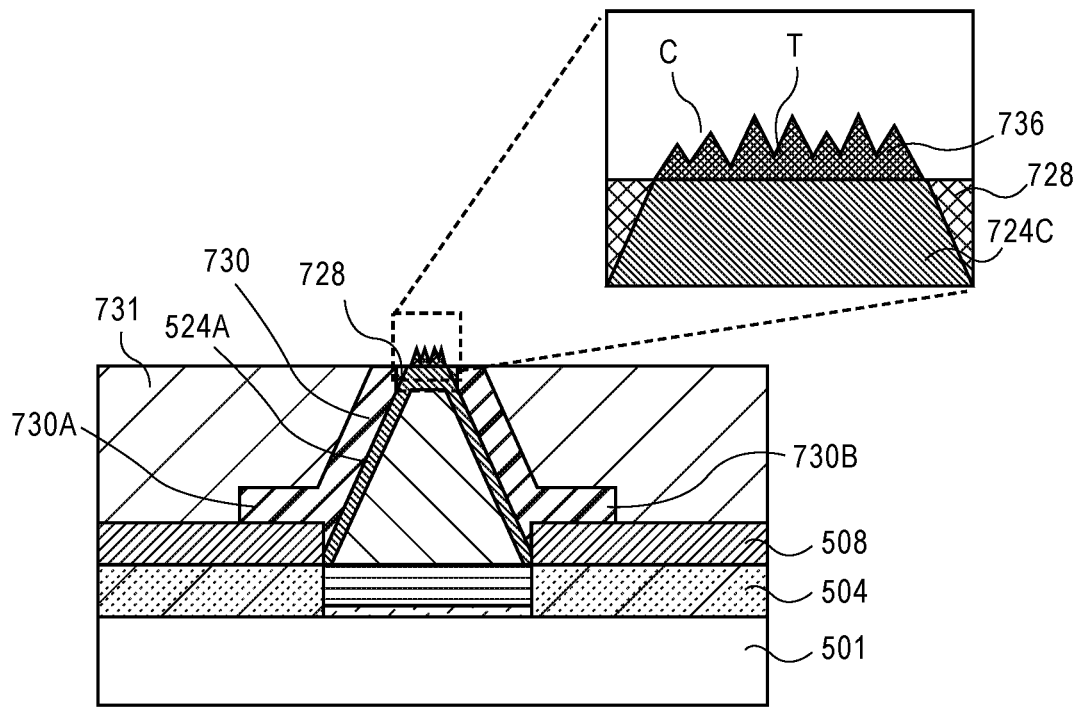

FIG. 7B illustrates the structure of FIG. 7A following the process of epitaxial growth of a doped source extension 736 on an exposed uppermost surface of the top polarization charge inducing layer 724C. In an embodiment, exemplary layer compositions, thicknesses and characteristics of the doped source extension 736, may be as described above for the doped source extension 336. In an embodiment, doped source extension 736 may be formed using an MOCVD process. In an embodiment, the MOCVD process has a process pressure that is approximately in the range of from 200 mB-500 mB. In one such embodiment, the MOCVD process has a process temperature that is approximately in the range of 700-800 degrees Celsius.

Figure 7C:
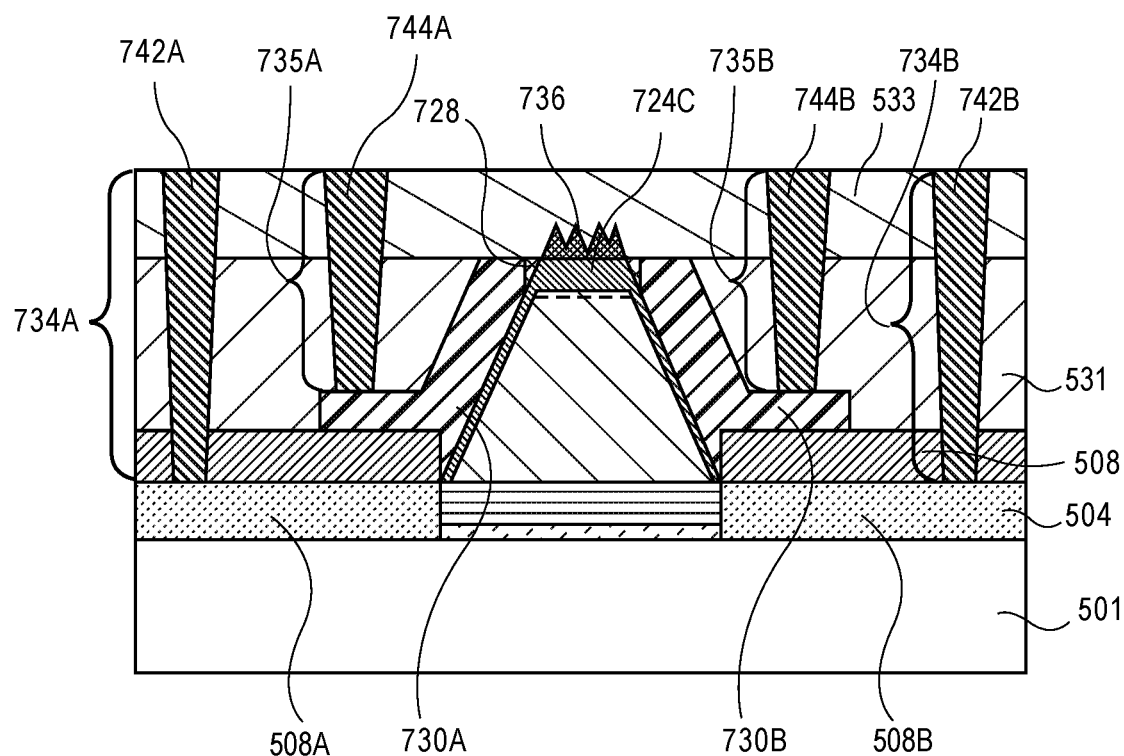

FIG. 7C illustrates the structure of FIG. 7B following the formation of first and second gate contacts 744A and 744B, respectively and first and second drain contacts 742A and 742B, respectively. In an embodiment, the structure of FIG. 7B undergoes a sequence of process operations similar to the sequence of process operations described in connection with FIGS. 5H-5J. In one such embodiment, a source contact is formed after formation of gate and drain contacts. In an embodiment, a second dielectric layer 533 is disposed on the doped source extension 736, on the uppermost surface of the dielectric layer 531, on the gate structure 730 and the dielectric hardmask layer 728. In an embodiment, via openings 734A and 734B are formed in the first dielectric layer 531 and second dielectric layer 533, over the first and second drain layer 504A and 504B, respectively. In one such embodiment, via openings 735A and 735B are formed over the first and second gate structures 730A and 730B, respectively. In an embodiment, the first and second drain contacts 742A and 742B, respectively, are formed in via openings 734A and 734B, respectively. In one such embodiment, the first and second gate contacts 744A and 744B are formed in via openings 735A and 735B, respectively. In an embodiment, exemplary materials and methods for forming the first and second drain contacts 742A and 742B, respectively, includes materials and methods such as described above in association with forming first and second drain contacts 542A and 542B, respectively. In embodiment, exemplary materials and methods for forming first and second gate contacts 744A and 744B, respectively includes materials and methods such as described above in forming first and second gate contacts 544A and 544B, respectively.

Figure 7D:
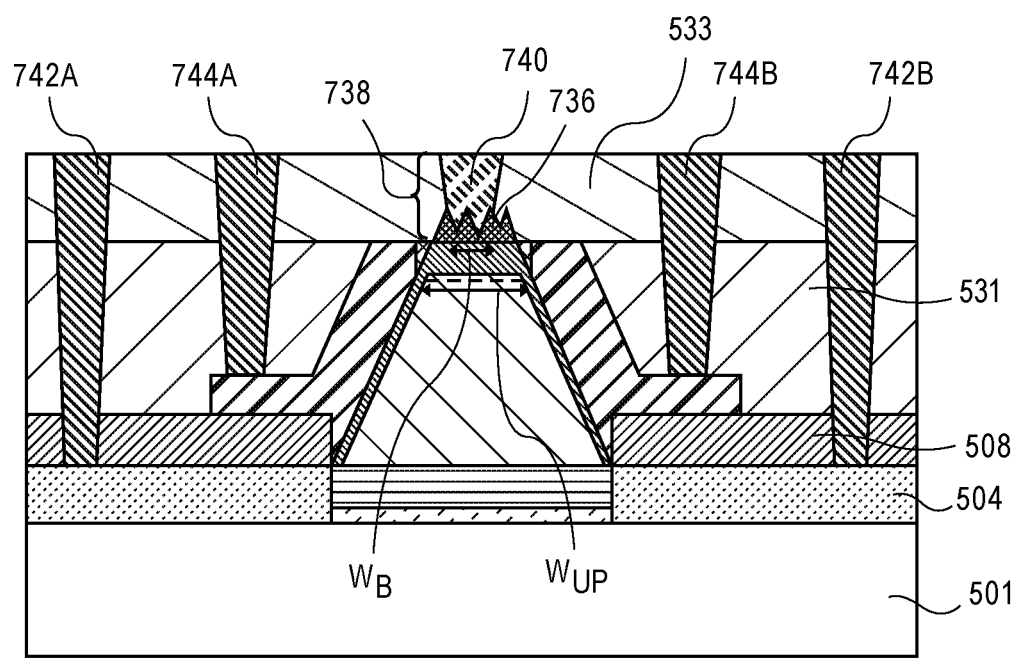

FIG. 7D illustrates the structure of FIG. 7C following the formation of a source contact 740. In an embodiment, a contact opening 738 is formed over the doped source extension 736. In one such embodiment, a plasma etch process is used to form contact opening 738. In an embodiment, the etch process utilized to form a contact opening 738, etches a portion of the doped source extension 736. In one such embodiment, uppermost portions of the doped source extension 736 is etched by an amount ranging from 3-10 nm. It is to be appreciated that in various embodiments, contact opening 738 can have a bottom width, $W_B$, that is smaller or larger than the width, $W_{UP}$, of top polarization charge inducing layer 724C. In an embodiment, source contact 740 is formed in the contact opening 738. In an embodiment, exemplary materials and methods for forming source contact 740 include materials and methods such as described above in association with forming source contact 540. In an embodiment, the source contact 740 is formed before forming first and second drain contacts 742A and 742B, respectively and first and second gate contacts 744A and 744B, respectively.

Figure 8A:
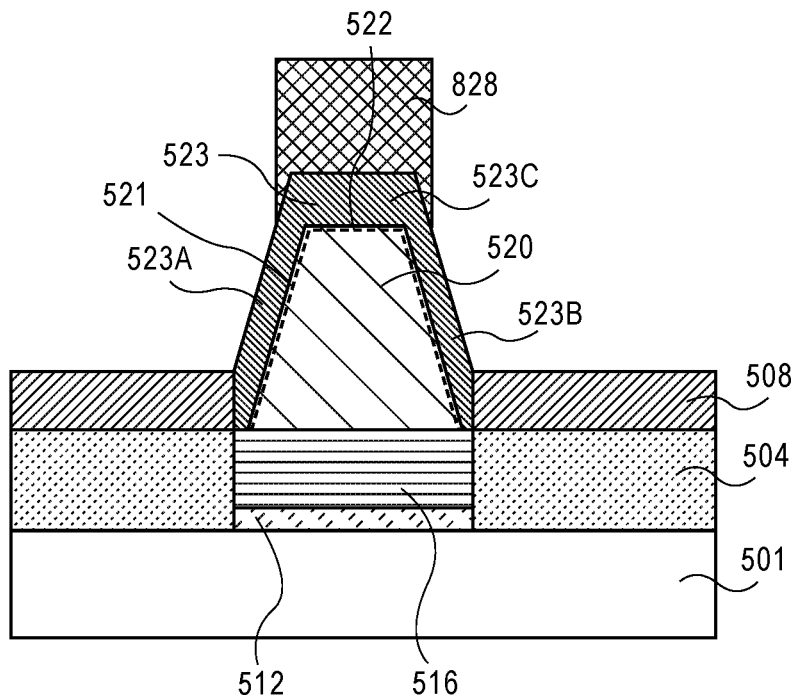
FIG. 8A-8C illustrate cross-sectional views representing various operations in a method of thinning the polarization charge inducing layer formed on sidewalls of the group III-N semiconductor material, in accordance with an embodiment of the present invention.
Figure 8B:
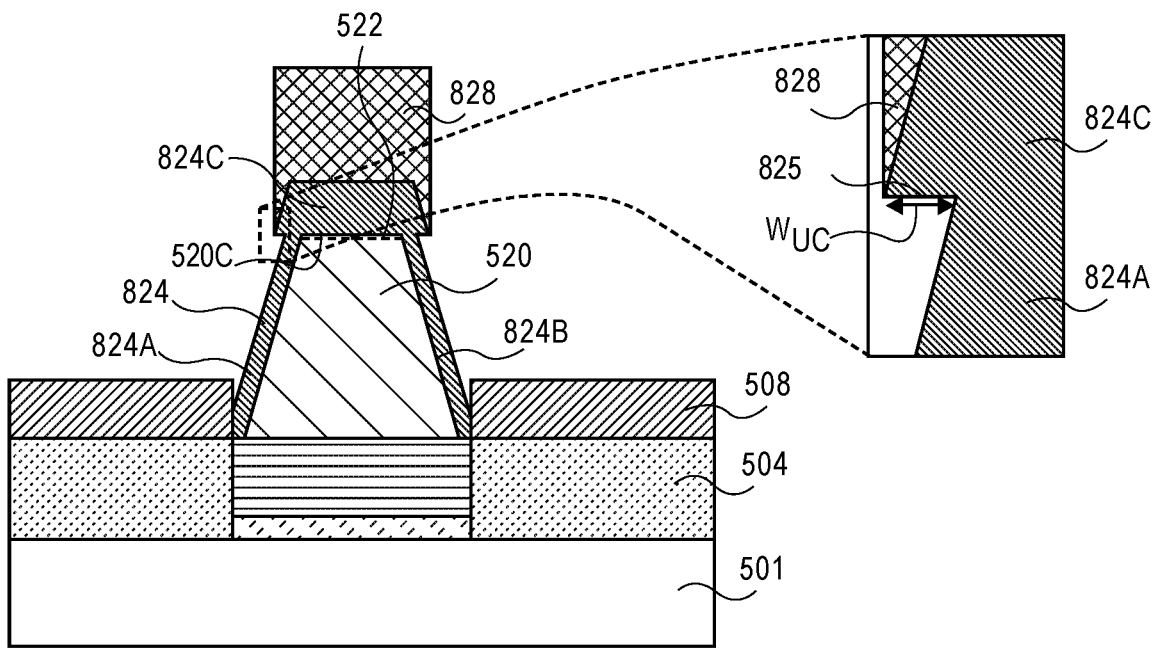
Figure 8C:
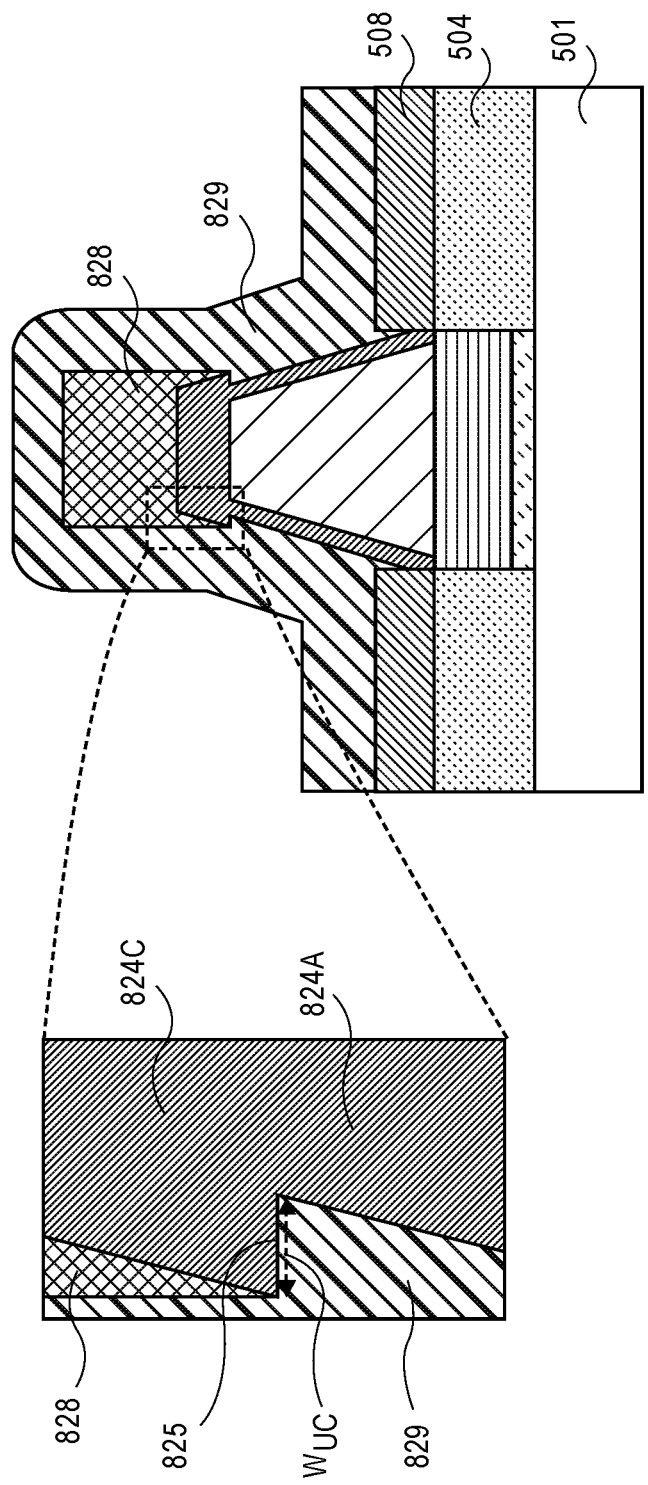

FIG. 8A-8C illustrates cross-sectional views representing various operations in a method of thinning the sidewall polarization charge inducing layer 523A and 523B formed on sidewalls of the group III-N semiconductor material sloped 520A and 520B respectively.

FIG. 8A illustrates the structure of FIG. 5C following the formation of a dielectric hardmask layer 828 on the top polarization charge inducing layer 523C and on portions of the sidewall polarization charge inducing layers 523A and 523B. Suitable materials and methods for the forming a dielectric hardmask layer 828 include materials and methods such as is described above in association with forming a dielectric hardmask layer 528. In one embodiment, dielectric hardmask layer 828, as depicted in FIG. 8A, has a rectangular profile. In other embodiments, dielectric hardmask layer 828 can have irregular circular and elliptical profiles. In an embodiment, the sidewall polarization charge inducing layer 523A and 524B have a thickness that is at least 10 nm.

FIG. 8B illustrates the structure of FIG. 8A following thinning of the sidewall portions of the polarization charge inducing layer 523. In an embodiment, thinning involves isotropic plasma etching. In an embodiment, the dielectric hardmask layer 828 is utilized to protect the top polarization charge inducing layer 523C during the etching process. In an embodiment, the sidewall polarization charge inducing layers 523A and 523B are unprotected during the etching. In an embodiment, the sidewall polarization charge inducing layers 824A and 824B, formed after the etching process, have a reduced thickness. In one such embodiment, the sidewall polarization charge inducing layers 824A and 824B, have a thickness that is the range of 1-2 nm. In an embodiment, the sidewall polarization charge inducing layers 824A and 824B have a reduced thickness that depletes 2DEG from the sidewalls of 520A and 520B. In one such embodiment, the polarization charge inducing layer 824C has a thickness that is unaltered after the etching process. In one such embodiment the 2DEG remains in the uppermost surface 520C.

In an embodiment, the top polarization charge inducing layer 824C is undercut by an amount, $W_{UC}$, as illustrated in the enhanced cross-sectional illustration of FIG. 8B. In an embodiment, the undercut surface 825 is substantially flat. In other embodiments, the undercut surface 825 has a concave shape. In an embodiment, the amount of undercut, $W_{UC}$, ranges from approximately 1 nm-20 nm.

FIG. 8C illustrates the structure of FIG. 8B following the formation of a gate stack 829 on the polarization charge inducing layer 824. Suitable materials and methods for the forming a gate stack 829 include materials and methods such as described above in association with forming a gate stack 529. In an embodiment, gate stack 829 is in contact with the surface 825, defined by the undercut, $W_{UC}$ as is depicted in the enhanced cross-sectional illustration of FIG. 8C. In another embodiment, the gate stack 829 is discontinuous along the surface 825 (not shown).

Figure 9:
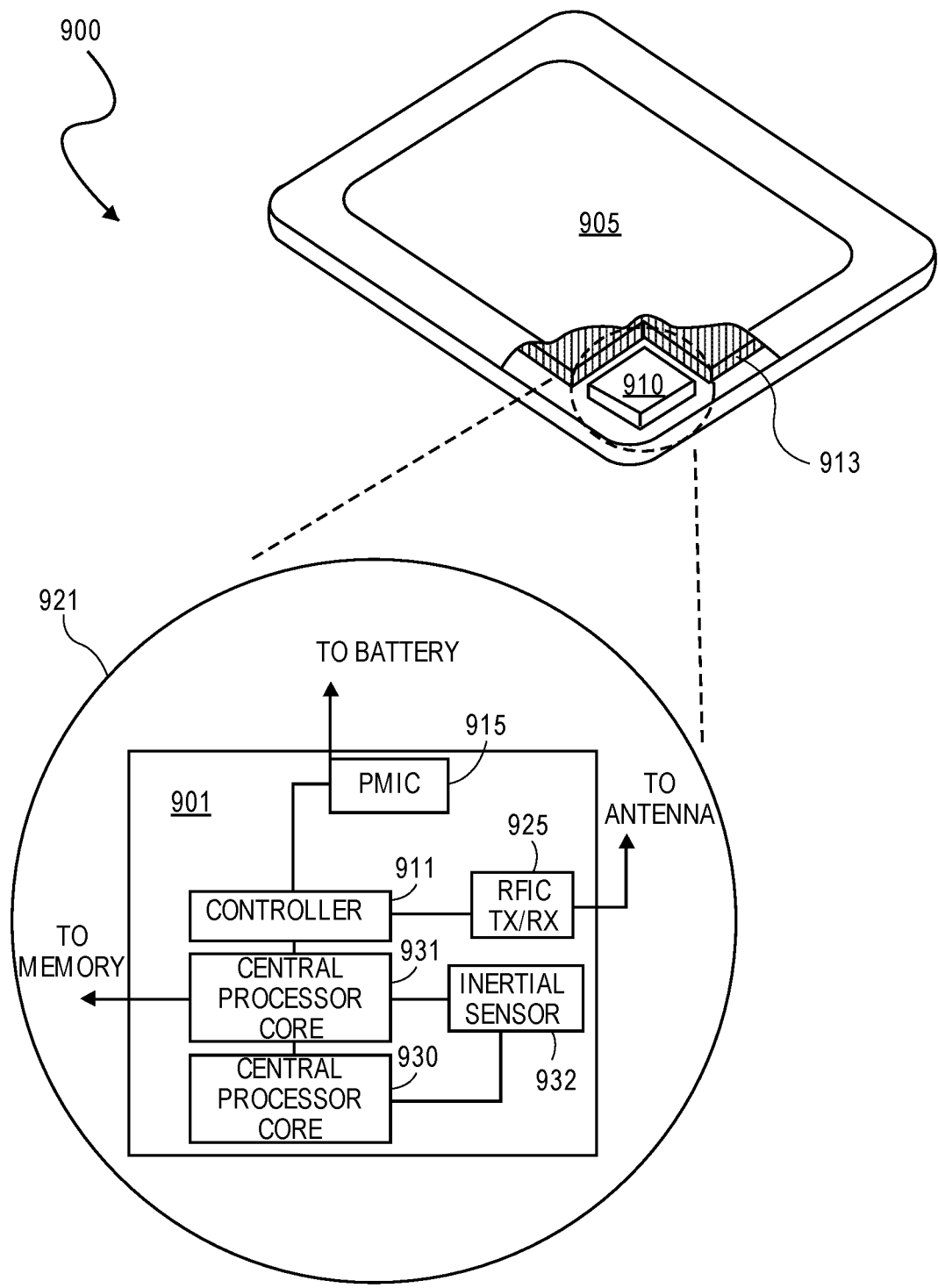
FIG. 9 is a functional block diagram of a group III-N SoC implementation of a mobile computing platform, in accordance with an embodiment of the present invention.

FIG. 9 is a functional block diagram of a group III-N SoC implementation of a mobile computing platform, in accordance with an embodiment of the present invention. The mobile computing platform 900 may be any portable device configured for each of electronic data display, electronic data processing, and wireless electronic data transmission. For example, mobile computing platform 900 may be any of a tablet, a smart phone, laptop computer, etc. And includes a display screen 905 that is in the exemplary embodiment a touchscreen (e.g., capacitive, inductive, resistive, etc.) permitting the receipt of user input, the SoC 910, and a battery 913. As illustrated, the greater the level of integration of the SoC 910, the more of the form factor within the mobile computing platform 900 that may be occupied by the battery 913 for longest operative lifetimes between charging, or occupied by memory (not depicted), such as a solid state drive, for greatest functionality.

Depending on its applications, mobile computing platform 900 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The SoC 910 is further illustrated in the expanded view 921. Depending on the embodiment, the SoC 910 includes a portion of a substrate 901 (i.e., a chip) upon which two or more of a power management integrated circuit (PMIC) 915, RF integrated circuit (RFIC) 925 including an RF transmitter and/or receiver, a controller 911 thereof, and one or more central processor core 930, 931 and inertial sensor 932 is fabricated. The RFIC 925 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The RFIC 925 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 915 and RFIC 925. In embodiments of the present invention, the PMIC 915 and RFIC 925 employ one or more of the vertical group III-N transistors as described herein (e.g., group III-nitride transistor 100). In an embodiment, the group III-N semiconductor material 120 including GaN with a polarization charge inducing layer 124 including AlGaN. In further embodiments the PMIC 915 and RFIC 925 employing the group III-nitride transistors described herein are integrated with one or more of the controller 911 and central processor cores 930, 931 provided in silicon CMOS technology monolithically integrated with the PMIC 915 and/or RFIC 925 onto the (silicon) substrate 101. It will be appreciated that within the PMIC 915 and/or RFIC 925, the high voltage, high frequency capable vertical group III-nitride transistors described herein need not be utilized in exclusion to CMOS, but rather silicon CMOS may be further included in each of the PMIC 915 and RFIC 925.

The group III-nitride transistors described herein may be specifically utilized where a high voltage swings present (e.g., 7-10V battery power regulation, DC-to-DC conversion, etc. within the PMIC 915). As illustrated, in the exemplary embodiment the PMIC 915 has an input coupled to the battery 913 and has an output provide a current supply to all the other functional modules in the SoC 910. In a further embodiment, where additional ICs are provided within the mobile computing platform 900 but off the SoC 910, the PMIC 915 output further provides a current supply to all these additional ICs off the SoC 910. Particular embodiments of the vertical group III-nitride transistors described herein permit the PMIC to operate at higher frequencies (e.g., 50x those possible in LDMOS implementations). In certain such embodiments, inductive elements within the PMIC (e.g., buck-boost convertors, etc.) may be scaled to much smaller dimensions. As such inductive elements in the PMIC account for 60-70% of chip area, embodiments of the PMIC implemented in the vertical group III-nitride transistors described herein offer a significant shrink over other PMIC architectures.

As further illustrated, in the exemplary embodiment the PMIC 915 has an output coupled to an antenna and may further have an input coupled to a communication module on the SoC 910, such as an RF analog and digital baseband module (not depicted). Alternatively, such communication modules may be provided on an IC off-chip from the SoC 910 and coupled into the SoC 910 for transmission. Depending on the group III-nitride semiconductor materials utilized, the vertical group III-nitride transistors described herein (e.g., vertical group III-N transistor 100) may further provide the large power added efficiency (PAE) needed from a power amplifier transistor having an Ft of at least ten times carrier frequency (e.g., a 1.9 GHz in an RFIC 925 designed for 3G or GSM cellular communication).

Figure 10:
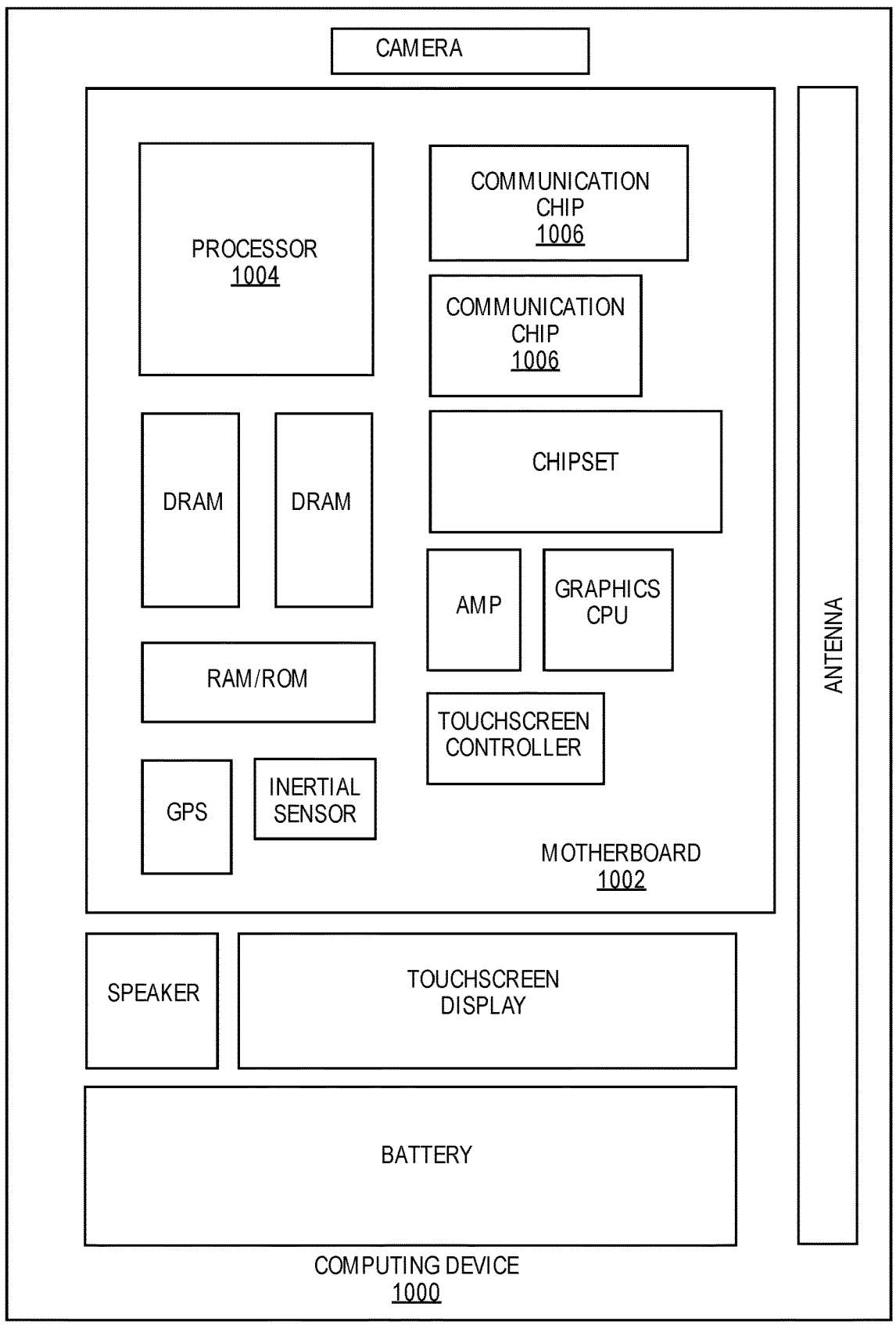
FIG. 10 illustrates a computing device in accordance with embodiments of the present invention.

FIG. 10 illustrates an example computing system 1000 implemented with the integrated circuit structures and/or techniques provided herein, in accordance with some embodiments of the present disclosure. As can be seen, the computing system 1000 houses a motherboard 1002. The motherboard 1002 may include a number of components, including, but not limited to, a processor 1004 that includes a plurality of vertical group III-nitride transistors integrated with silicon CMOS transistors and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated vertical group III-N transistors formed using the disclosed techniques in accordance with an example embodiment or vertical group III-N transistors integrated with silicon CMOS transistor devices. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may be implemented with the techniques and/or structures variously described herein, such that the communication chip 1006 includes one or more vertical group III-N transistors including a dual drain/gate and single source hetero structure design, for example.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Figure 11:
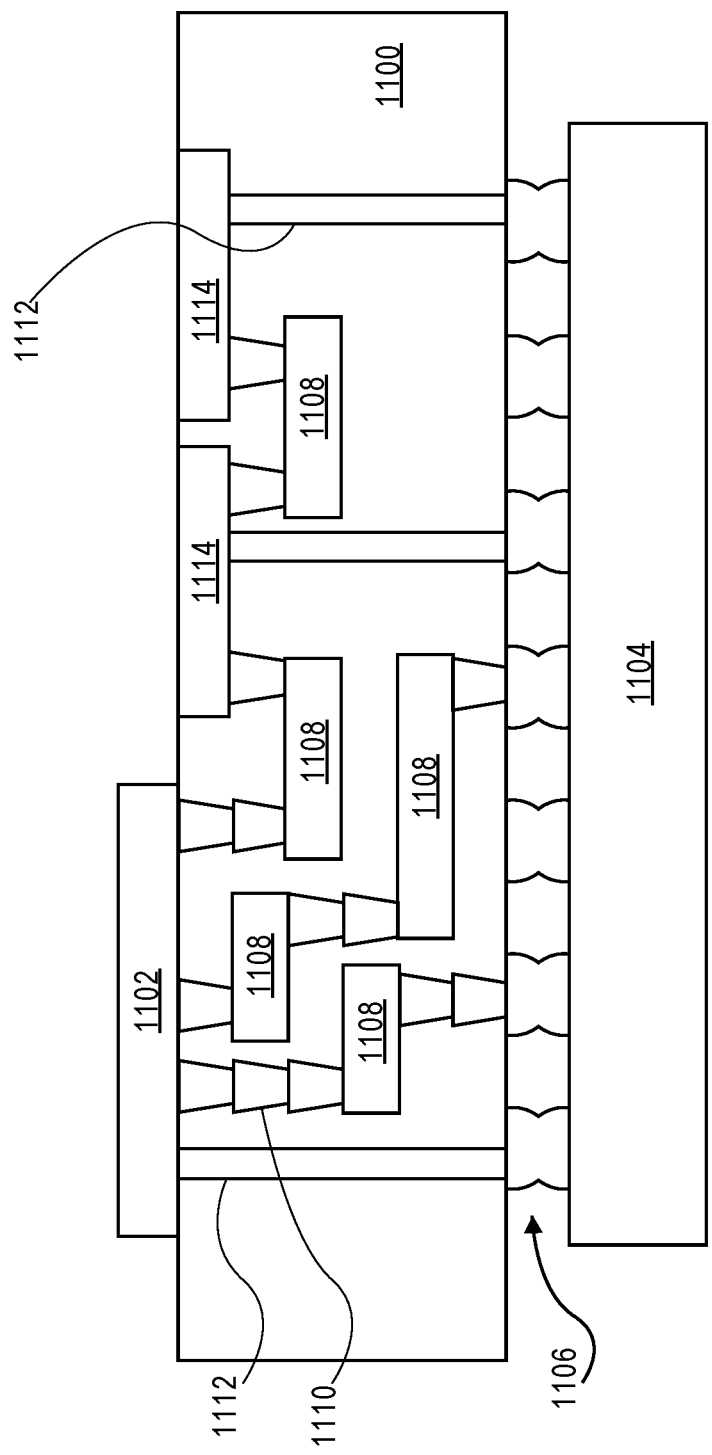
FIG. 11 illustrates an interposer in accordance with embodiments of the present invention.

FIG. 11 illustrates an interposer 1100 that includes one or more embodiments of the invention. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and via openings 1110, including but not limited to through-silicon via openings (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the invention, apparatuses or processes disclosed herein may be used in the fabrication of interposer 1100.

Thus, embodiments of the present invention include vertical group III-N devices and their methods of fabrication.

Example 1

A semiconductor structure including a doped buffer layer is disposed above a substrate; the semiconductor structure including a group III-nitride (III-N) semiconductor material disposed on the doped buffer layer. The group III-N semiconductor material further includes sloped sidewall and a planar uppermost surface, a drain region adjacent to the doped buffer layer, an insulator layer on the drain region. A polarization charge inducing layer is disposed on and conformal with the group III-N semiconductor material. The polarization charge inducing layer has a first portion that is disposed on the sloped sidewall of the group III-N semiconductor material and a second portion that is disposed on the planar uppermost surface of the group III-N semiconductor material. The first portion of the polarization charge inducing layer has a thickness and the second portion of the polarization charge inducing layer has a thickness greater than the thickness of the first portion. A gate structure is disposed on the first portion of the polarization charge inducing layer. A source region is disposed on the second portion of the polarization charge inducing layer.

Example 2

The semiconductor structure of Example 1, further includes a highly n-doped semiconductor material disposed between the second portion of the polarization charge inducing layer and the source region.

Example 3

The semiconductor structure of Example 1 or Example 2, wherein the first portion of the polarization charge inducing layer includes a gate to drain separation portion disposed between the group III-N semiconductor material and the insulator layer and is in contact with the doped buffer layer.

Example 4

The semiconductor structure of Example 1, Example 2 or Example 3, wherein, the first portion of the polarization charge inducing layer is disposed on an uppermost surface of the insulator layer, and not between the group III-N semiconductor material and the insulator layer.

Example 5

The semiconductor structure of Example 1, wherein the group III-N semiconductor material includes gallium nitride (GaN), and the polarization charge inducing layer includes a group III-N semiconductor material that includes aluminum.

Example 6

The semiconductor structure of Example 1, Example 2, Example 3 or Example 4, wherein the portion of the polarization charge inducing layer disposed on the uppermost surface of the group III-N semiconductor material has a thickness that is at least 10 times greater than the portion disposed on the sloped sidewalls of the group III-N semiconductor material.

Example 7

The semiconductor structure of Example 1, Example 2, Example 3, Example 4 or Example 6, wherein the polarization charge inducing layer is disposed on the sloped sidewalls and on the uppermost surface of the group III-N semiconductor material and has a thickness in the range of 1 nm-3 nm and 10 nm-30 nm, respectively.

Example 8

The semiconductor structure of Example 1, wherein the gate structure comprises a gate electrode and a gate dielectric layer between the gate electrode and the polarization charge inducing layer. And the gate structure includes one or more layers of a metal and a metal alloy.

Example 9

The semiconductor structure of Example 1, wherein the doped buffer layer includes n-type impurity dopants.

Example 10

A semiconductor structure including a doped buffer layer is disposed above a substrate. A group III-N semiconductor material is disposed on the doped buffer layer. The group III-N semiconductor material has a pair of sloped sidewalls and a planar uppermost surface. A first and a second drain region is disposed on the substrate separated by the doped buffer layer. An insulator layer is disposed on the first and the second drain regions. A polarization charge inducing layer is disposed on and conformal with the group III-N semiconductor material. The polarization charge inducing layer has a first portion that is disposed on the sloped sidewalls of the group III-N semiconductor material and a second portion that is disposed on the planar uppermost surface of the group III-N semiconductor material. The first portion of the polarization charge inducing layer has a thickness and the second portion has a thickness that is greater than the thickness of the first portion. A first gate and a second gate structure are disposed on the first portion of the polarization charge inducing layer. The first and the second gate structures are separated by the group III-N semiconductor material. A source region is disposed on the second portion of the polarization charge inducing layer.

Example 11

The semiconductor structure of Example 10, further includes a highly n-doped semiconductor material disposed between the second portion of the polarization charge inducing layer and the source region.

Example 12

The semiconductor structure of Example 10, wherein the first portion of the polarization charge inducing layer includes a gate extension portion disposed between the group III-N semiconductor material and the insulator layer, wherein the gate extension portion is in contact with the doped buffer layer.

Example 13

The semiconductor structure of Example 10, Example 11, or Example 12 wherein the first portion of the polarization charge inducing layer is disposed on an uppermost surface of the insulator layer, and not between the group III-N semiconductor material and the insulator layer.

Example 14

The semiconductor structure of Example 10, wherein the group III-N semiconductor material includes gallium nitride (GaN) and the polarization charge inducing layer includes a group III-N semiconductor material that includes aluminum.

Example 15

The semiconductor structure of Example 10, 11, 12, or 13, wherein the portion of the polarization charge inducing layer disposed on the uppermost surface of the group III-N semiconductor material has a thickness that is at least 10 times greater than the portion disposed on the sloped sidewalls of the group III-N semiconductor material.

Example 16

The semiconductor structure of Example 10, 11, 12, 13 or 14, wherein the polarization charge inducing layer is disposed on the sloped sidewalls and on the uppermost surface of the group III-N semiconductor material has a thickness in the range of 1-3 nm and 10-30 nm, respectively.

Example 17

The semiconductor structure of Example 10, wherein the gate structure includes a gate electrode and a gate dielectric layer between the gate electrode and the polarization charge inducing layer. The gate structure further includes of one or more layers of a metal and a metal alloy.

Example 18

The semiconductor structure of Example 10, wherein the doped buffer layer includes n-type impurity dopants.

Example 19

A method of fabricating a group III-nitride (III-N) transistor includes forming a material layer stack on a substrate. The method further includes forming a metal layer and an insulator layer on the metal layer. A trench is formed in the material layer stack. A doped buffer layer is formed in the trench. A group III-N semiconductor material is formed in the trench and on the doped buffer layer, wherein the group III-N semiconductor material has sidewalls and an uppermost surface. A polarization charge inducing layer is formed on the sidewalls and on the uppermost surface of the group III-N semiconductor material. The portion of the polarization charge inducing layer formed on the sidewall of the group III-N semiconductor material has a thickness that is less than a thickness of the portion of the polarization charge inducing layer on the uppermost surface of the group III-N semiconductor material. A dielectric hardmask layer is formed on an uppermost surface of the polarization charge inducing layer and on a portion of a sidewall surface of the polarization charge inducing layer. A gate stack is formed on the polarization charge inducing layer on the sidewall of the of the polarization charge inducing layer, and on the hardmask layer. A dielectric layer is formed on the gate stack, on the insulator layer. A planarizing process is performed to expose the hardmask layer. A source contact is formed on an uppermost surface of polarization charge inducing layer.

Example 20

The method of fabricating a group III-nitride (III-N) transistor of Example 19, wherein forming the group III-N semiconductor material includes leaving an exposed portion of the uppermost surface of the doped buffer layer.

Example 21

The method of fabricating a group III-nitride (III-N) transistor of Example 19, wherein forming the polarization charge inducing layer includes forming the polarization charge inducing layer on a portion of an uppermost surface of the doped buffer layer and on the group III-N semiconductor material.

Example 22

The method of fabricating a group III-nitride (III-N) transistor of Example 19 or 21, wherein thinning the polarization charge inducing layer further includes forming the dielectric hardmask layer and performing an isotropic plasma etch.

Example 23

The method of fabricating a group III-nitride (III-N) transistor of Example 19 or 21, further comprising forming a highly n-doped material above the uppermost surface of the polarization charge inducing layer and within the source metal layer.

What is claimed is:

1. A semiconductor structure, comprising:
a doped buffer layer above a substrate;
a group III-nitride (III-N) semiconductor material disposed on the doped buffer layer, the group III-N semiconductor material having a sloped sidewall and a planar uppermost surface;
a drain region disposed adjacent to the doped buffer layer;
an insulator layer disposed on the drain region;
a polarization charge inducing layer disposed on and conformal with the group III-N semiconductor material, the polarization charge inducing layer having a first portion disposed on the sloped sidewall of the group III-N semiconductor material and a second portion disposed on the planar uppermost surface of the group III-N semiconductor material, wherein the first portion has a thickness and the second portion has a thickness greater than the thickness of the first portion;
a gate structure disposed on the first portion of the polarization charge inducing layer; and
a source region disposed on the second portion of the polarization charge inducing layer.

2. The semiconductor structure of claim 1, further comprising a highly n-doped semiconductor material between the second portion of the polarization charge inducing layer and the source region.

3. The semiconductor structure of claim 1, wherein the first portion of the polarization charge inducing layer comprises a gate to drain separation portion disposed between the group III-N semiconductor material and the insulator layer and is in contact with the doped buffer layer.

4. The semiconductor structure of claim 1, wherein the first portion of the polarization charge inducing layer is disposed on an uppermost surface of the insulator layer, and not between the group III-N semiconductor material and the insulator layer.

5. The semiconductor structure of claim 1, wherein the group III-N semiconductor material includes gallium nitride (GaN), the polarization charge inducing layer includes a group III-N semiconductor material that includes aluminum.

6. The semiconductor structure of claim 1, wherein the second portion of the polarization charge inducing layer disposed on the uppermost surface of the group III-N semiconductor material has a thickness that is at least 10 times greater than the first portion disposed on the sloped sidewalls of the group III-N semiconductor material.

7. The semiconductor structure of claim 1, wherein the polarization charge inducing layer disposed on the sloped sidewalls and on the uppermost surface of the group III-N semiconductor material has a thickness in the range of 1 nm-3 nm and 10 nm-30 nm, respectively.

8. The semiconductor structure of claim 1, wherein the gate structure comprises a gate electrode and a gate dielectric layer between the gate electrode and the polarization charge inducing layer, and the gate structure comprises one or more layers of a metal and a metal alloy.

9. The semiconductor structure of claim 1, wherein the doped buffer layer includes n-type impurity dopants.

10. A semiconductor structure, comprising:
a doped buffer layer above a substrate;
a group III-N semiconductor material disposed on the doped buffer layer, the group III-N semiconductor material having a pair of sloped sidewalls and a planar uppermost surface;
a first and a second drain region disposed on the substrate separated by the doped buffer layer;
an insulator layer disposed on the first and the second drain regions;
a polarization charge inducing layer disposed on and conformal with the group III-N semiconductor material, the polarization charge inducing layer having a first portion disposed on the sloped sidewalls of the group III-N semiconductor material and a second portion disposed on the planar uppermost surface of the group III-N semiconductor material, wherein the first portion has a thickness and the second portion has a thickness greater than the thickness of the first portion;
a first gate and a second gate structure disposed on the first portion of the polarization charge inducing layer, the first and the second gate structures separated by the group III-N semiconductor material; and
a source region disposed on the second portion of the polarization charge inducing layer.

11. The semiconductor structure of claim 10, further comprising a highly n-doped semiconductor material between the second portion of the polarization charge inducing layer and the source region.

12. The semiconductor structure of claim 10, wherein the first portion of the polarization charge inducing layer comprises a gate extension portion disposed between the group III-N semiconductor material and the insulator layer and is in contact with the doped buffer layer.

13. The semiconductor structure of claim 10, wherein the first portion of the polarization charge inducing layer is disposed on an uppermost surface of the insulator layer, and not between the group III-N semiconductor material and the insulator layer.

14. The semiconductor structure of claim 10, wherein the group III-N semiconductor material includes gallium nitride (GaN) and the polarization charge inducing layer includes a group III-N semiconductor material that includes aluminum.

15. The semiconductor structure of claim 10, wherein the portion of the polarization charge inducing layer disposed on the uppermost surface of the group III-N semiconductor material has a thickness that is at least 10 times greater than the portion disposed on the sloped sidewalls of the group III-N semiconductor material.

16. The semiconductor structure of claim 10, wherein the polarization charge inducing layer disposed on the sloped sidewalls and on the uppermost surface of the group III-N semiconductor material has a thickness in the range of 1 nm-3 nm and 10 nm-30 nm, respectively.

17. The semiconductor structure of claim 10, wherein the gate structure comprises a gate electrode and a gate dielectric layer between the gate electrode and the polarization charge inducing layer, and the gate structure comprises one or more layers of a metal and a metal alloy.

18. The semiconductor structure of claim 10, wherein the doped buffer layer includes n-type impurity dopants.

19. A method of fabricating a group III-nitride (III-N) transistor, the method comprising:
forming a material layer stack on a substrate, the material layer stack comprising a metal layer and an insulator layer on the metal layer;
forming a trench in the material layer stack;
forming a doped buffer layer in the trench;
forming a group III-N semiconductor material in the trench and on the doped buffer layer, wherein the group III-N material has sidewalls and an uppermost surface;

forming a polarization charge inducing layer on the sidewalls and on the uppermost surface of the group III-N semiconductor material;

where the portion of the polarization charge inducing layer formed on the sidewall of the group III-N semiconductor material has a thickness less than a thickness of the portion of the polarization charge inducing layer on the uppermost surface of the group III-N semiconductor material;

forming a dielectric hardmask layer on an uppermost surface of the polarization charge inducing layer and on a portion of a sidewall surface of the polarization charge inducing layer;

forming a gate stack on the polarization charge inducing layer on the sidewall of the polarization charge inducing layer, and on the hardmask layer;

forming a dielectric layer on the gate stack, on the insulator layer planarizing to expose the hardmask layer;

forming a source contact on an uppermost surface of the polarization charge inducing layer.

20. The method of claim 19, wherein forming the group III-N semiconductor material comprises leaving an exposed portion of the uppermost surface of the doped buffer layer.

21. The method of claim 19, wherein forming the polarization charge inducing layer comprises forming the polarization charge inducing layer on a portion of an uppermost surface of the doped buffer layer and on the group III-N semiconductor material.

22. The method of claim 19, wherein thinning the polarization charge inducing layer further comprises forming the dielectric hardmask layer and performing an isotropic plasma etch.

23. The method of claim 19, wherein the method further comprises forming a highly n-doped material above the uppermost surface of the polarization charge inducing layer.

* * * * *